(12) United States Patent
Solomon

(10) Patent No.: US 6,886,148 B2
(45) Date of Patent: Apr. 26, 2005

(54) METHOD AND SYSTEM FOR DISPLAYING VLSI LAYOUT DATA

(75) Inventor: Jeffrey M. Solomon, Millbrae, CA (US)

(73) Assignee: The Board of Trustees of the Leland Stanford Jr. University, Stanford, CA (US)

( * ) Notice: Subject to any disclaimer, the term of this patent is extended or adjusted under 35 U.S.C. 154(b) by 89 days.

(21) Appl. No.: 10/314,957

(22) Filed: Dec. 10, 2002

(65) Prior Publication Data

US 2003/0076722 A1 Apr. 24, 2003

Related U.S. Application Data

(63) Continuation of application No. 09/901,028, filed on Jul. 10, 2001, now Pat. No. 6,493,858.
(60) Provisional application No. 60/278,001, filed on Mar. 23, 2001.

(51) Int. Cl.[7] .............................................. G06F 17/50
(52) U.S. Cl. ........................................... 716/11; 716/3
(58) Field of Search ...................................... 716/11, 3

(56) References Cited

U.S. PATENT DOCUMENTS

| | | | | |
|---|---|---|---|---|
| 4,783,749 A | * | 11/1988 | Duzy et al. ................. | 364/491 |
| 5,086,477 A | * | 2/1992 | Yu et al. ....................... | 382/8 |
| 5,481,717 A | | 1/1996 | Gaboury ...................... | 395/700 |
| 5,760,783 A | | 6/1998 | Migdal et al. .............. | 345/430 |

OTHER PUBLICATIONS

IC Station Stream View by Mentor Graphics Product Description Data Sheet, 2 pp.
Virtuoso Layout Editor by Cadence Design Systems, Inc. Product Description Data Sheet, 3 pp.

* cited by examiner

Primary Examiner—M. Tran
(74) Attorney, Agent, or Firm—Fleshner & Kim, LLP

(57) ABSTRACT

A VLSI layout editor and method for using same that increases display and re-display speed and accuracy uses properties inherent to VLSI layouts that allows them to be displayed efficiently and accurately independent of the canonical expression of the VLSI design. The VLSI layout editor and methods for using same use precomputed images that each represent a portion of the VLSI layout, a hierarchy cache that includes multiple LOD versions of selected sub-designs in the pre-computed images, and selected direct determination of the viewable representation from the canonical expression for at least one LOD. Apparatus and methods according to the present invention can render a particular type of data whose canonical form is smaller than its corresponding displayed image thereof when the displayed image has geometric properties that allow heuristics and rasterization for dynamic and accurate expansion using selected combined techniques. Texture mapping and mipmapping can be used to accurately reduce, expand and reorder layers in a viewable image expanded from a canonical expression of the VLSI layout.

47 Claims, 17 Drawing Sheets

Both rasterized - error at abutment

Top rect rasterized

Two Rects from the same layer

METHOD AND SYSTEM FOR DISPLAYING VLSI LAYOUT DATA

This application is a Continuation of application Ser. No. 09/901,028 filed Jul. 10, 2001 (now U.S. Pat. No. 6,493,858), and claims priority to U.S. Provisional Application Ser. No. 60/278,001, filed Mar. 23, 2001, whose entire disclosure is incorporated herein by reference, and is subject to a contract made by Defense Advanced Research, Contract No. RFP-MOA904-98-R-5855.

BACKGROUND OF THE INVENTION

1. Field of the Invention

Method and apparatus to display a VLSI layout design, and in particular, a CAD/CAM method and apparatus that displays a VLSI design in photo-realistic detail and in real-time.

2. Background of the Related Art

Computer systems are most always used for the display of data in VLSI designs. The amount of data to display can vary from design to design, and the largest designs can contain hundreds of millions of separate pieces of information. Manipulation of the design database is part of the design and manufacturing of VLSI chips. At some point in the design, it is necessary to view the data in a graphical form on a display screen. A VLSI layout viewer and/or editor is used for this task.

A VLSI layout viewer reads received data descriptions of VLSI designs including sizes and locations of elements (e.g., polygons) on each of a plurality of layers in the design. The VLSI layout viewer generates images representing a view of the entire (or specific subset of selected layers) at various magnifications (scales), and draws the images on a display screen. Further, the VLSI layout viewer generates images representing various re-orderings of the layers (or a subset of the layers) of the VLSI design. For example, a specific layer can be brought to the front for viewing.

A VLSI layout editor is also a VLSI viewer, however the VLSI editor also allows for the modification of the data in the design. Both an editor and a viewer are generally used to display the VLSI data on a screen.

A first related art VLSI layout viewer displays for any viewpoint by iterating over all features visible for that viewpoint and simply drawing all the features to the display screen. At magnification (or zoom), this process can take minutes to draw an entire image. Additionally, since many of the features of the image are sub-pixel and/or fractional-pixel in dimension, the features appear incorrect, or "aliased" in the final image since the features will be drawn on pixel boundaries.

A second related art technique modifies the first to speed the drawing process by choosing not draw anything in certain areas of the design. Instead of drawing the details of all of the features, a solid box is drawn that represents that entire area. Drawing one solid box is much faster than drawing each smaller feature. However, the image quality is decreased, and the image is inaccurate and does not resemble a photo-realistic image.

A third related art technique simply draws less, for example, instead of drawing millions of features, only a fraction of the features are drawn. The criteria used by the third related art technique as to whether a selected feature is drawn is determined by randomly selecting every Nth feature (e.g., N=10). The assumption is that random selection is as good as any other criteria. The drawing speed is increased, but it does not increase by a factor of N since each polygon still needs to be tested randomly for display.

A fourth related art technique to speed up the VLSI drawing process is to only draw features that will appear on the screen as a certain size or larger. The fourth related art technique works no matter the size of the VLSI design because all the features will continue to scale down. As a drawing editor zooms out to higher scales, all features get smaller. A threshold is set and features that will appear less than N pixels on the screen are not drawn. For example, N is set to 1, then any feature less than 1 pixel on a side will be discarded. This method of culling speeds up the drawing process, but generates inaccuracies in the image.

A fifth related art technique is to determine which features are not visible at all and then, those features are not drawn. Features correspond to different layers of a VLSI layout and can be viewed in different stacking orders. That is, one layer may appear (on the display) as "above" or "below" another VLSI design layer. If one layer is going to appear above another layer, then the underneath layer is not drawn because it is occluded by the "above" layer upon display when the entire VLSI image is drawn.

A sixth related art technique is to draw everything but allow the user to halt the drawing process while the drawing is still ongoing. Thus, an arbitrarily long redraw process can at least be stopped by a user at any time. The related art VLSI layout editors use this technique to specifically address the problem of slow redraw times.

A seventh related art technique is to convert a VLSI design into an image and to view the image of the design. However, the size of the image file created when the design is converted to an image could be terabytes, and consequently, the available techniques to view it as an image are limited. One related art option is a clipmap image disclosed in U.S. Pat. No. 5,760,783. However, using a clipmap or any other pure image viewing solution disadvantageously generates a transformation cost (both in terms of computation time and memory cost), and the inability to change the image quickly and easily once the transformation has been done.

As described above, the related art VLSI layout viewers have various disadvantages. The related art VLSI layout viewers have slow display and re-draw times for VLSI designs. Further, such problems will get worse as the number of polygons in modern VLSI layouts reach into to the tens or hundreds of millions and displaying each of those polygons at once can take terabytes of data. In addition, inaccuracies occur in the display of the designs in an attempt to increase display speed. When viewed at low magnification, most of the polygons can be smaller than a single pixel in one or both dimensions, and drawing the polygons without proper filtering produces noticeable aliasing artifacts.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a layout viewer and method of using same that uses a pre-computed image that represents some portion of the VLSI design.

Another object of the present invention is to provide a layout viewer and method of using same that uses previously drawn portions of a VLSI design in a currently drawn VLSI design.

Another object of the present invention is to provide a layout viewer and method of using same that provides real-time navigation of a VLSI layout independent of the size of the design.

Another object of the present invention is to provide a layout viewer and method of using same that provides an accurate photo-realistic representation of the VLSI layout on a display screen.

Another object of the present invention is to provide a layout viewer and method of using same that displays a VLSI layout without aliasing artifacts.

Another object of the present invention is to provide a layout viewer and method of using same that provides a representation of the VLSI layout independent of a size of the VLSI layout.

Another object of the present invention is to provide a layout viewer and method of using same that uses a direct rendering of polygons and drawing of texture data to display images of a VLSI layout.

Another object of the present invention is to provide a layout viewer and method of using same that uses different methods of display for a VLSI design depending on the level of magnification.

Another object of the present invention is to provide a layout viewer and method of using same that provides accurate real-time navigation of a displayed representation of a canonically expressed VLSI design independent of the size of the displayed image representation using a bounded representation of the canonical expression for display.

Another object of the present invention is to provide a layout viewer and method of using same that eliminates long redraw problems and incorrect depictions when rendering a representation on a display screen of a canonically expressed VLSI layout.

Another object of the present invention is to provide a layout viewer and method of using same that determines and pre-computes displayable representations of sub-designs of the VLSI design for a subset of the possible displayable magnifications.

Another object of the present invention is to provide a layout viewer and method of using the same that renders the data from a VLSI layout in either an opaque or semi-transparent style.

Another object of the present invention is to provide a VLSI layout viewer and method of using the same that draws VLSI data opaquely so that data stacked "above" occludes data stacked "below".

Another object of the present invention is to provide a VLSI layout viewer and method of using the same that draws VLSI data semi-transparently so that data will be drawn with an opacity that allows data stacked "below" to be visible relative to data stacked "above."

Another object of the present invention is to provide a VLSI layout viewer and method of using the same that draws VLSI data semi-transparently so that data drawn with nothing "underneath" appears opaque.

To achieve at least these objects and other advantages in a whole or in part and in accordance with the purpose of the present invention, as embodied and broadly described, there is provided a VLSI layout editor that includes a first memory that stores a canonical expression of a VLSI layout having a plurality of layers and a display controller coupled to the first memory that generates a displayable representation of ordered layers of the VLSI layout that tracks changes in a user viewpoint, wherein the displayable representation includes a precomputed image that represents a portion of the VLSI layout, and wherein the precomputed image is used in two or more user viewpoints.

To further achieve at least these objects and other advantages in whole or in part and in accordance with the purpose of the present invention, as embodied and broadly described, there is provided a method of viewing a VLSI layout design that includes loading a VLSI layout design into a first memory, determining a number of LODs from a base representation level to a top level of a chip pyramid according to the first representation, determining a first transition threshold and second transition threshold at a higher LOD from the first transition threshold that subdivide the chip pyramid into three sections, and displaying a representation of the VLSI layout design using a first displaying technique below the first transition threshold, a second displaying technique between the two transition thresholds and a third displaying technique above the second transition.

To further achieve at least these objects and other advantages in whole or in part and in accordance with the purpose of the present invention, as embodied and broadly described, there is provided a method of rendering a viewable representation of an integrated circuit (IC) layout that includes loading a canonical form of the IC layout into a first memory, determining a chip pyramid structure having a plurality of levels of detail (LOD) from a base LOD to a top LOD according to the canonical form of the IC layout, determining hierarchy data for selected sub-designs in the canonical form and storing the hierarchy data in a second memory, determining a selected LOD in the chip pyramid to display the IC layout according to an input viewpoint, displaying the IC layout using stored sub-images of selected portions of the canonical form when the selected LOD is above a first threshold, and displaying the IC layout by using the canonical form to directly display polygons when the selected LOD is below the first threshold.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 16A shows a complete design and FIG. 16B shows only the contents of a hierarchy cache; FIG. 17A shows a synthetic image of a design generated according to a preferred embodiment of the present invention and FIG. 17B shows computer generated images of an actual die photograph of the design.

DETAILED DESCRIPTION OF PREFERRED EMBODIMENTS

Figure 1:
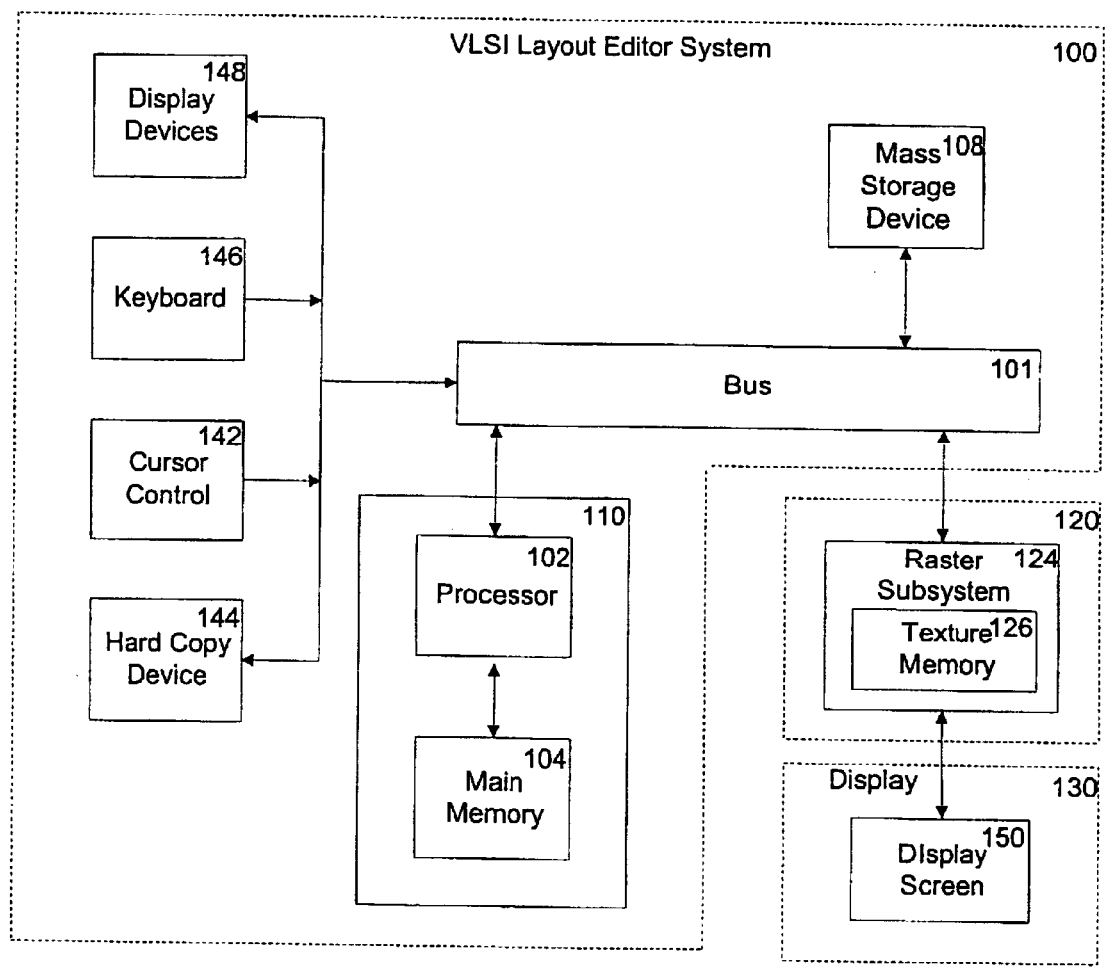
FIG. 1 is a diagram that illustrates a first preferred embodiment of a layout editor for a VLSI design according to the present invention.

A preferred embodiment of a VLSI layout editor according to the present invention will now be described. FIG. 1 is a block diagram of a VLSI layout editor system 100 that includes a graphics subsystem 120 for generating display images for a display system 130 according to the present invention.

System 100 includes a mass storage device 108 and a VLSI layout viewer 110, which includes a host processor 102 and a main memory 104 coupled through a data bus 101. The mass storage device 108 is preferably used to store vast amounts of digital data. The mass storage device 108 initially stores one or more VLSI layouts in a canonical form. For example, the mass storage device 108 can include one or more hard disk drives, floppy disk drives, optical disk drives, tape drives, CD ROM drives, or any number of other types of storage devices having media for storing data digitally. For ease of description, this application will hereafter use the term VLSI layout viewer when describing viewing or corresponding editing capabilities of preferred embodiments according to the present invention since modifications include drawing and updates to the displayed and underlying canonical forms of a VLSI layout.

Different types of input and/or output (I/O) devices are also coupled to the VLSI layout viewer 110 through the bus 101 for the benefit of an interactive user. An alphanumeric keyboard 146 and a cursor control device 142 (e.g., a mouse, trackball, joystick, etc.) are used to input commands and information. The output devices can include a hard copy device 144 (e.g., a printer or plotter) for printing data or other information onto a tangible medium, and additional display devices 148 can be coupled to the VLSI layout viewer 110 to provide for multimedia capabilities.

The graphics subsystem 120 is coupled between the VLSI layout viewer 110 and the display system 130 and includes a raster subsystem 124 coupled to a texture memory 126. Processor 102 provides the graphics subsystem 120 with descriptions (e.g., polygons, textures, sub-element hierarchy textures, etc.) of a display image in object space. The graphics subsystem 120 transforms the description of the image (and the objects displayed therein) from object space into screen space. The display system 130 includes a display device having a display screen 150.

Raster subsystem 124 maps texture data from texture memory 126 to pixel data in the screen space (e.g., polygonal) descriptions. Pixel data and texture data are eventually filtered, accumulated, and can be stored before output transmission to the display system 130, the display screen 150 or the display devices 148. The digital data representing the output display image can also be saved, transmitted over a network, or sent to other applications.

The preferred embodiment of the VLSI layout editor system 100 is described in terms of a system environment. Description in these terms is provided for convenience only. It is not intended that the invention be limited to application in this example environment. In fact, after reading the following description, it will become apparent to a person skilled in the relevant art how to implement the invention in alternative environments.

Graphics data (e.g., a polygonal description or a pre-computed portion of a display image or scene) is provided from the viewer 110 through the data bus 101 to the graphics subsystem 120. Alternatively, as would be apparent to one skilled in the art, at least some of the functionality of generating a polygonal or pre-computed description could be transferred to the computer graphics subsystem as desired.

The viewer 110 passes the pre-computed (e.g., texture) data to the graphics subsystem 120 and can use the texture memory 126 to generate and manage portions of the display image on the display screen 150 as described below. Including the software and/or hardware in the processor 102 for generating and managing the display image of the VLSI layout is one example for implementing the preferred embodiment of the VLSI layout editor system 100. Separate modules or processor units for generating and managing the display image of the VLSI layout could be provided along the data bus 101 or in the graphics subsystem 120, as would be apparent to one skilled in the art considering this description.

Figure 2:
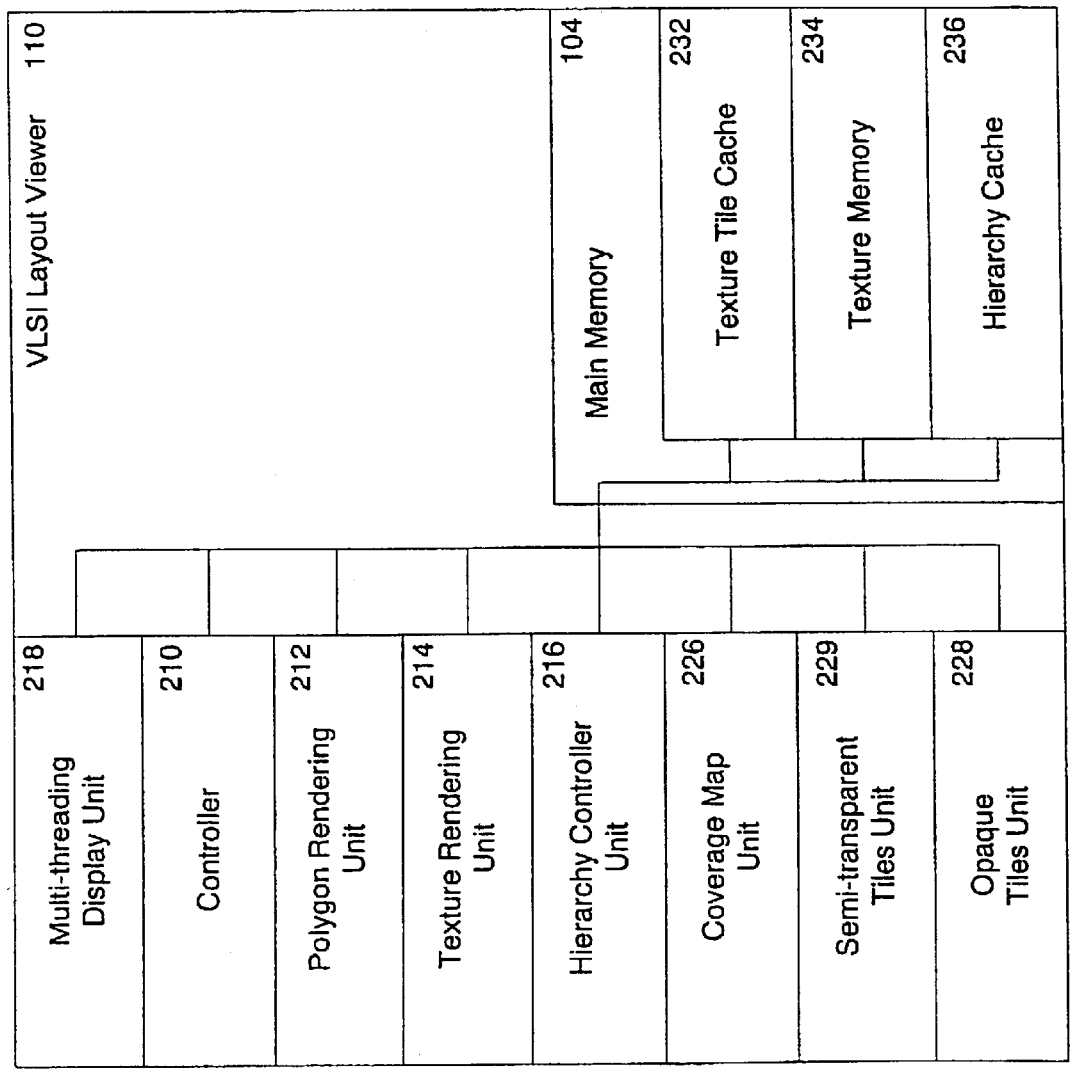
FIG. 2 is a diagram that illustrates a block diagram of a preferred embodiment of a control system for the layout editor of FIG. 1.

A preferred embodiment of the VLSI layout viewer 110 according to the present invention will now be described. As shown in FIG. 2, the viewer 110 includes a controller 210, a main memory 104, a polygon rendering unit 212, a texture rendering unit 214, a hierarchy controller unit 216, multi-threading display unit 218, a coverage map unit 226 that can include opaque and semi-transparent tile units 228, 229. The viewer 110 further includes texture tile cache 232, texture or pyramid cap memory 234 and hierarchy cache 236 preferably located in the main memory 104.

As shown in FIG. 1, the VLSI layout viewer 110 is preferably implemented on the processor 102 including the main memory 104. However, the VLSI layout viewer 110 can also be implemented on a special purpose computer, a programmed microprocessor, microcontroller and peripheral integrated circuit elements, an ASIC or other integrated circuit, a hardwired electronic or logic circuit such as a discrete element circuit, a programmable logic device such as a PLD, PLA, FGPA or PAL, or the like. In general, any device on which a finite state machine capable of implementing a chip pyramid including transitions T1–T3 and the flowcharts shown in FIGS. 9–15 can be used to implement the VLSI viewer 110.

The viewer 110 preferably reuses data for an image displayed on the screen 150 of the VLSI layout between multiple depictions with/without combinations of magnifications changes, viewpoint changes, layering changes and transformation changes (e.g., colors selected) on the screen 150. The selected portions of the data being reused are preferably precomputed and accurately represent portions or sub-elements of the VLSI layout (e.g., textures). Multiple magnifications of selected sub-elements in the VLSI layout are preferably determined according to a design or user viewpoint and are pre-computed (e.g., a hierarchy) by the viewer 110. The viewer 110 preferably provides a user real-time navigation of a VLSI layout independent of the size of the design, and creates an accurate representation of the design at any magnification using bounded resources in the implementation.

To more clearly delineate the present invention, an effort is made throughout the specification to adhere to the following term definitions as consistently as possible. A "canonical form" or native form of a VLSI layout is a mathematical description of locations of every element (e.g., polygons) on all layers of the integrated circuits (ICs) on the corresponding VLSI design or instantiated in a VLSI chip. The memory resources required to store the canonical form of an VLSI layout, such as a corner-stitched data structure, is typically very small compared to the memory resources required to hold a fully expanded image of the VLSI layout. Further, a VLSI layout as used hereafter is intended to refer to any layout used to manufacture any integrated circuit (IC) not only an integrated circuit with a certain number of elements.

A "texture" is a static image including elements called texels. The values contained in each texel can be any type of visual information such as intensity, transparency or, most commonly, red green blue (RGB) triplets. A "texel" in a texture can be distinguished from a pixel on the display screen 150 in that a texel can represent more or less area than a pixel depending on the texture's final scaled size on the display screen 150. "Texture image data" is any computer memory image that can be used again, which can be the opposite of drawing to the screen (e.g. frame buffer) and discarding the contents. Examples of textures include computing images in the CPU memory for repeated use with graphics hardware and allowing the graphics unit to compute the image but then saving it back to the CPU for repeated use or allowing it remain on graphics unit but in a way that it can be re-used.

"Texture mapping," in a simple form, is a way to apply a texture as a decal to a polygon. "Mipmapping" is a way to specify down-sampled pixel views of a texture that are used to represent the texture at successive multiple "levels of detail (LOD)". A "texture MIP-map" refers to conventional MIP-map representations of a texture map at successive multiple LODs. Each down-sampled representation of a texture in a one level higher LOD of a mipmap is ¼ the size of the texture it was sampled from. Thus, the multiple LODs provide varying degrees of resolution. When abstractly viewed with each mipmap level stacked on top of each other, the whole data structure is known as a mipmap pyramid or simply as a "mipmap."

The size of a modern microprocessor, when viewed as an image, or an image mipmap is extremely large. A VLSI layout for a modern microprocessor that is 20 mm×20 mm on a side with a grid resolution of 0.01 $\mu$m leads to a base image of width and height of 2 million texels. If each texel were 16 bits, the size of just the base image would be 64 terabytes.

When drawing a polygon with a mipmapped texture, the final pixel values of the polygon are computed by determining the level of detail (LOD) on a per pixel basis. The LOD is the ratio of the pixel area to texture area in the texture's base units, starting from a base level or LOD zero (0). For example, a 100×100 texel texture drawn as a flat 100×100 pixel image in a display screen would be a LOD 0 (i.e., one texture texel maps to one screen pixel) and would be rendered or drawn by using the base mipmap level. If the same texture were to be mapped to an area 50×50 pixels in a scene, the first mipmap level, which is four times smaller, would be most appropriately used. When the image is to be rendered at an intermediate size (e.g., 75×75 pixels), an application could either reduce the first level, magnify the second level, or blend the two mipmap levels. To render a 2D image parallel to the screen, as is the case with IC layouts, the same LOD applies to all pixels.

To correctly down-sample an image, an ideal low-pass filter (a sine filter) can be applied that removes the appropriate high frequencies. Usually though, an approximation of the sinc filter, a box filter is used for such operations because the box filter requires much less computation, yet still provides acceptable quality. The definition of the box filter used in the present invention is to average the RGB values in a 2×2 square of texels to obtain the new down-sampled value.

Preferred embodiments according to the present invention use the synthetic nature of IC layouts and do not simply draw the layouts solely as images or polygons. The preferred embodiment of the VLSI layout viewer 110 preferably uses multiple transformations according to the canonical form to rapidly and accurately draw the VLSI design. The viewer 110 preferably draws an input canonical form using a novel structure of a chip pyramid.

Figure 3:
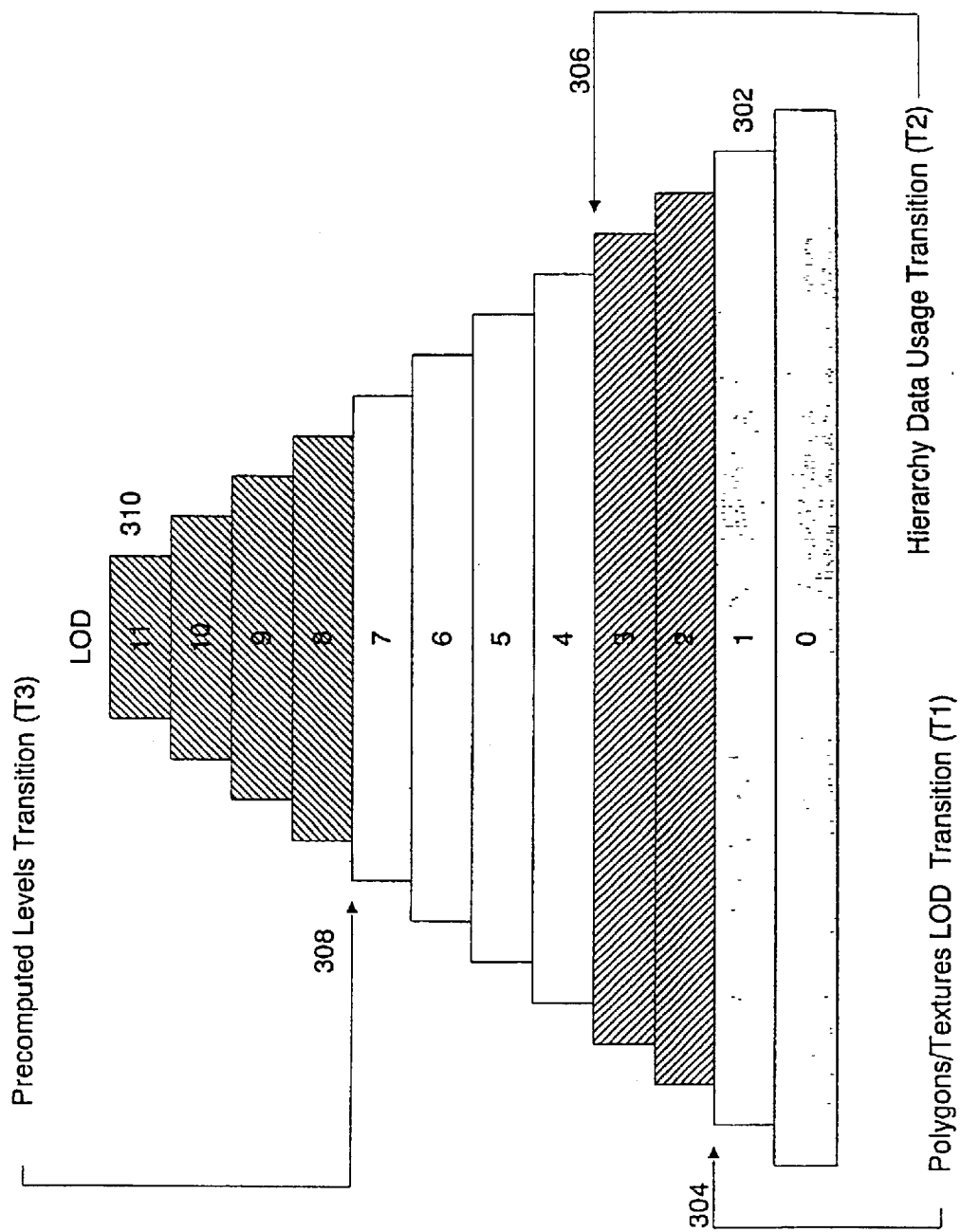
FIG. 3 is a diagram that illustrates a preferred embodiment of a chip pyramid having multiple regions of operation.

FIG. 3 illustrates a preferred embodiment of a primary structure for displaying a VLSI design according to preferred embodiments of the present invention. As shown in FIG. 3, a chip pyramid 300 includes information about where different types of texture data will preferably be used in rendering, and the chip pyramid 300 also includes a region where no texture data is used. As shown in FIG. 3, the chip pyramid 300 preferably has four distinct regions, each delineated by a LOD. Each of these LODs are computed at initialization and based on the size of a corresponding VLSI design, the size of the display screen and heuristics of the design data itself. Each higher LOD in the chip pyramid 300 is preferably one quarter the resolution of the level below. Although LODs "higher" in the chip pyramid 300 actually have lower levels-of-detail, the LODs having less resolution will be referred to as higher in the pyramid.

Dimensions of LOD 0 302 are preferably computed directly from the bounding box of the VLSI design. The dimensions are independent of the number of elements in the VLSI design and are determined from the smallest box that covers every element of the design or some other suitable predefined area of the design.

Dimensions of an LOD of a first transition T1 304 are computed so that above the first transition T1, texture data is used, while below the first transition T1, the design elements are drawn directly. The first transition T1 is preferably chosen at a point where, above the first transition T1, it becomes unprofitable to draw elements directly because visually inaccurate aliasing artifacts become noticeable and because the redraw time can become sufficiently slow. For example, a user viewpoint can start at LOD 0 and move up LODs in the chip pyramid 300. As the user viewpoint moves up, more and mote elements become visible and each of the visible elements apparently becomes smaller. At some point, the viewpoint becomes far enough so that two disadvantages occur. The first is that the polygons being drawn become less than a pixel in any or all dimensions and are drawn in an aliased fashion if drawn directly to the screen. The second disadvantage is that the graphics capabilities of the computer systems may not be able to draw the entire screen fast enough to maintain the illusion of animation. The second disadvantage may decrease as computer systems drawing capabilities rise with technological advances, and the ability to draw more and more elements at once will increase. However, VLSI designs are continuing to increase in complexity and can offset technological advantages. Ultimately, the first transition T1 of the chip pyramid 300 allows drawing elements in an unaliased and accurate fashion. Accurate means taking measures to ensure that the non-integet scaled dimensions of objects are modeled accurately. The LOD of the first transition T1 304 is preferably determined by finding the average minimum dimension of each element in the design and determining which LOD will coincide to that dimension being too small to draw on the screen directly. Assume, for example, in a design, that the average smaller dimension of each element is found to be about 50 units and the smallest desired element that is drawn on the screen is 5 pixels. An average minimum dimension of a polygon in this example design will be 50 units at LOD 0, 25 at LOD 1, 12.5 at LOD 2, 6.25 at LOD 3 and 3.125 at LOD 4. Therefore, for this example, the LOD T1 is taken to be LOD 3 since 6.25 is the smallest dimension greater than 5 pixels. The LOD T1 can be determined by the following equation:

$$2^{LOD\ T1} \geq (ave\_mm\_dimen)/(smallest\_pixel\_size)$$

In this case, ave_min_dimen is 50 units and smallest_pixel_size is 5 pixels. Preferred embodiments according to the present invention preferably use this heuristic to determine the first transition T1. However, the present invention is not intended to be so limited and other heuristics are possible and may be as effective. Finally, as shown in FIG. 3, only two LOD levels in the section of the chip pyramid 300 are below the LOD of the first transition T1 302. This is exemplary only. As illustrated in the example, the number of LODs below the first transition T1 is solely based on the design. Further, according to the present invention, the first transition T1 may be omitted and texture data can be used throughout the drawing process. However, such a drawing process is unnecessary and wasteful at LODs less than the first transition T1 since the inherent drawing capabilities of the computer system are sufficient for both accuracy and speed.

A LOD of a second transition T2 306 is also shown in the preferred embodiment of the chip pyramid 300 of FIG. 3. The LOD T2 306 preferably represents the transition in the chip pyramid 300 from not using hierarchy data below to using hierarchy data above. As described below and shown in FIGS. 5B and 6, a portion of a design can be converted into a coverage map. As described below and shown in FIG. 8, the coverage map information is preferably a primary structure to store the information in a hierarchy cache such as hierarchy cache 236. However, according to the preferred embodiments, using a coverage map is only effective when the majority of its elements are non-zero. For LODs close to the first transition T1, average coverage maps for designs were determined to generally be sparse, which makes the coverage maps unprofitable to use in creating texture tile data. For this reason alone, the second transition T2 306 delineates where computational profit occurs from use of the hierarchy data stored in coverage map form. According to the preferred embodiments, the LOD of the second transition T2 306 is heuristically preferably chosen two LOD levels higher than the first transition T1. However, the present invention is not intended to be so limited, and alternative heuristics could choose a different way to place the second transition T2.

A LOD of a third transition T3 is the point at which a pyramid cap region of the chip pyramid 300 begins. The pyramid cap preferably defines a region of the chip pyramid 300 that specifically uses precomputed image data, e.g., precomputed texture data. The texture data is preferably precomputed because having some view of the design available at all times increases drawing speed, and creating a full zoom view of a design when a global layer and/or color change is made increases drawing speed. The number of LODs to include in the pyramid cap is chosen so that the pyramid includes the LOD appropriate to display the entire VLSI design in a window on a computer system that is the full size of the physical computer display. In current technology, for example, average smallest computer monitor dimensions are approximately 640×480 pixels and average largest computer monitor dimensions are approximately 2048×1536 pixels. When using texture data from a pyramid cap region above the third transition T3, the texture data is preferably taken directly from a special prescribed area of memory. In addition, no computation on the fly is preferably necessary since the pyramid cap region is specifically precomputed.

The region between the second transition T2 306 and the third transition T3 308 is preferably the portion of the chip pyramid 300 where texture data is computed on the fly using hierarchy data. As shown in FIG. 3, four LODs are between the second transition T2 306 and the third transition T3 308, but this is only exemplary. Depending on the size of the VLSI design, the actual number of LODs in this region can be arbitrary.

A highest LOD 310 on the chip pyramid 300 is preferably chosen as the smallest allowable view of the design. It is possible that dimensions of LOD 310 could be 1 by 1 texel, however, it is alternatively intended to set the dimensions of the highest LOD 310 so that the design is no smaller than some fraction of the window size.

As shown in FIG. 3, the four regions of operation in the chip pyramid 300 have been determined and are preferably chosen to optimally draw the VLSI design with respect to speed, accuracy, and system resources. In contrast, the related art VLSI layout viewers that simply draw all features of the VLSI design would only operate as in a region below LOD T1 in the chip pyramid 300, which disadvantageously causes speed and severe accuracy problems described, most notably when viewing the design at LODs above the first transition T1. Further, the related art clipmap would draw the VLSI design as if operating only in the region above the third transition T3, which disadvantageously causes an enormous resource and flexibility burden on a VLSI rendering system such as the system 100 as described above.

Functions of the preferred embodiments of the viewer 110 that implement the capability to receive and transform the VLSI design according to a user controlled viewpoint will now be described. For the viewer 110 to draw a semiconductor chip design, a VLSI layout is preferably first converted into a corresponding chip pyramid, which is then used by the viewer 110 to draw the canonical form of the VLSI layout as an image on the screen 150.

Preferably, the width and height of the image is directly computed from the size of the VLSI layout and the underlying grid resolution. For example, a 1 mm×1 mm layout with a grid resolution of 1 μm would have a base image width and height of 1,000. Once the base image width and height have been determined, the next step is to determine at least transition points and remaining LODs to the top of the chip pyramid 300.

Figure 4:
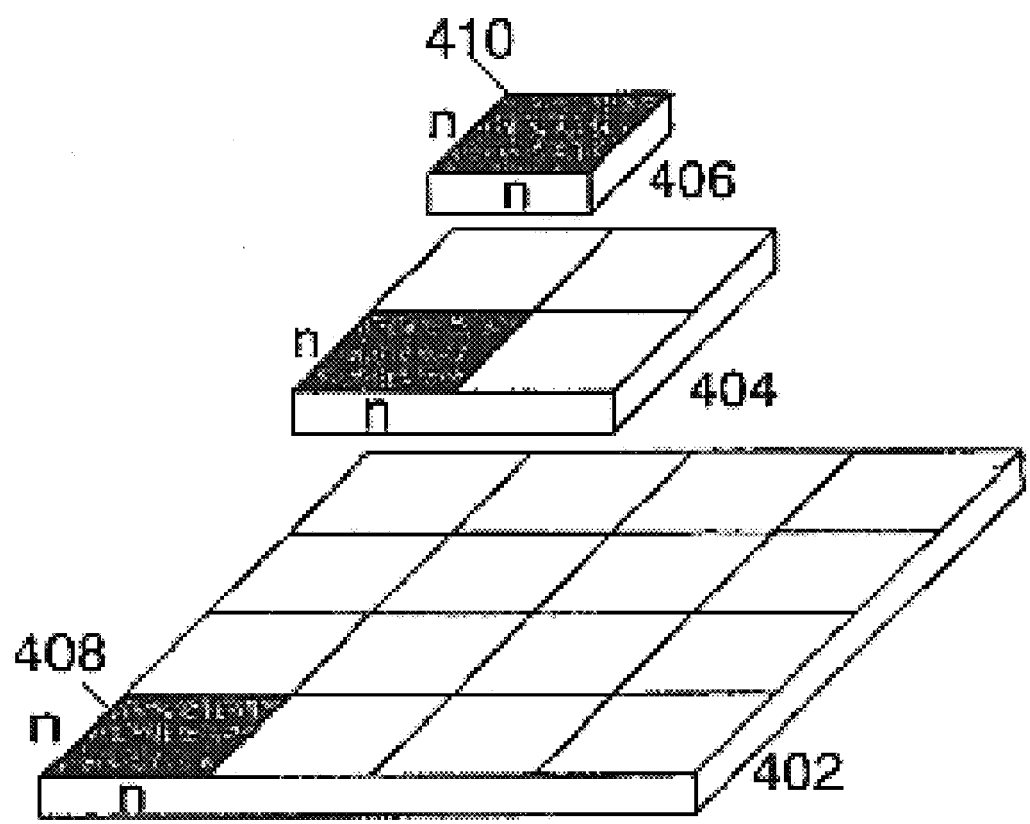
FIG. 4 is a diagram that illustrates a tiled texture pyramid.

The chip pyramid 300 preferably incorporates a "tiled texture pyramid" (TTP) as shown in FIG. 4 that is distinguished from a mipmap pyramid in that each pyramid level has an array of texture tiles where the size of each of the tiles, in texels, is fixed. Each level of a mipmap pyramid is thought of as one texture. For large IC layouts, the size of all but the highest levels in the pyramid could easily eclipse not only the hardware limits of a host platform but also the size of the main memory 104. The tiles in the upper levels of the TTP represent more layout area than those in lower levels even though each texture tile physically consumes the same amount of memory. LOD 0 402, LOD 1 404, and LOD 2 406 all represent the same image but at different resolutions. Since LOD 0 402 is a finer resolution, it consumes more memory. Tile 408 in LOD 0 is the same physical size as tile 410 in LOD 2, but it only represents 1/16 of the area of the tile 410 since it is two LODs lower in the TTP.

Using the texture tiled pyramid TTP within portions of the chip pyramid, lets the viewer 110 define the tile size to meet the hardware limits of the host platform. Using the TTP, the viewer 110 creates only the portions of a chip pyramid level that are needed at any one time. Further, the viewer 110 uses the TTP to preferably provide a multi-threaded implementation.

The TTP is preferably used in the preferred embodiment of the viewer 110. However, the present invention is not intended to be so limited as to imply that the TTP representation is the only implementation that can achieve the desired effect.

The texture rendering unit 214 preferably creates each texture tile by computing the values of the texels for that tile. The texture rendering unit 214 can create the texel values by first rasterizing at the base level, and then down-sampling. Although accurate texel values are produced, computation and memory cost to create a tile high up in the pyramid using this approach are prohibitive. In a worst case of, for example, the memory cost for the top most tile would be equal to the base area of the VLSI layout, and the computation cost to filter down to a single tile. Preferably the texture rendering unit 214 creates tiles high up in the pyramid directly from the canonical expression, which obviates the requirement to rasterize at the base level.

Figure 5A:
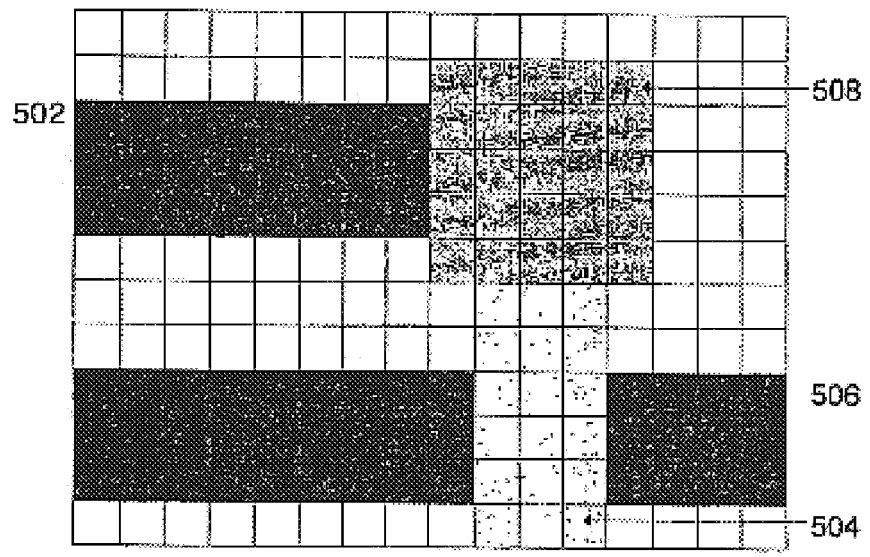
FIG. 5A is a diagram that illustrates polygons aligned with a texel grid.

A simple rasterization example is shown in FIG. 5A. FIG. 5A is a diagram that shows two wires 502, 506 running horizontally, a third wire 504 running vertically, and a via 508. The coordinates of the rectangles coincide with the texel boundaries, which corresponds to a texture tile at the base level of the TTP. As shown in FIG. 5A, the grid resolution of the layout and the size of the texels are equal such that all rectangles will fall on integer boundaries. Rasterization is direct and relatively simple because either a rectangle covers a texel completely or not at all. The final color of the texel is either the background color, the color of a single layer, or the blended color of two or more layers depending on the rendering style.

Figure 5B:
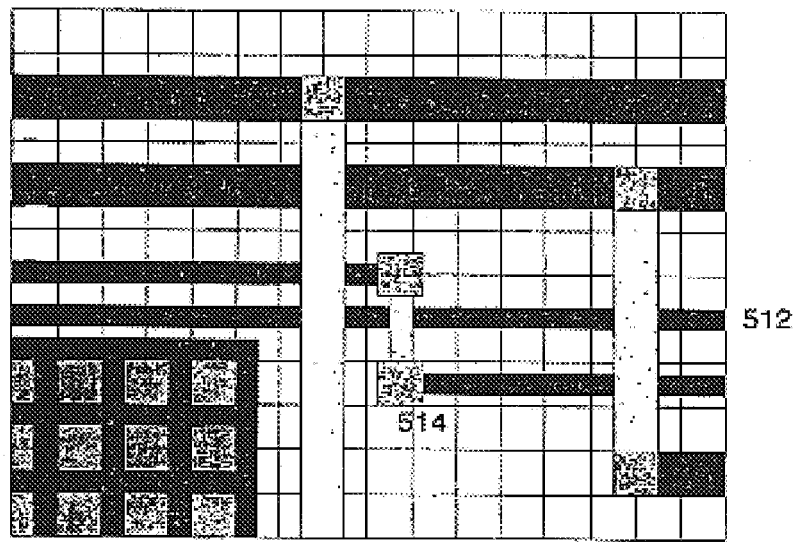
FIG. 5B is a diagram that illustrates polygons not aligned with a texel grid.

FIG. 5B is a diagram that shows an assortment of wires such as wire 512 and vias such as via 514 that fall arbitrarily on the texel grid, which occurs whenever the scaled coordinates of the rectangles have non-integer values. The scale factor is given by $2^{1/LOD}$. This case can only occur on pyramid levels other than the base level of the chip pyramid. As shown in FIG. 5B, the rasterization process is not as simple. The computation of the texel's final color must take into account that the rectangle only partially covers the texel. To do this, preferably the amount of coverage of a given rectangle over a given texel is used. A basis or starting point of coverage is the same as the well-known graphics idiom alpha (α), which represents a color's opacity. A color that does not completely "fill" a texel can equivalently be considered to partially cover a portion of the texel (coverage), or to completely cover the texel at some opacity (alpha α). The symbol α is used to represent either the coverage or opacity of a texel interchangeably.

Figure 6:
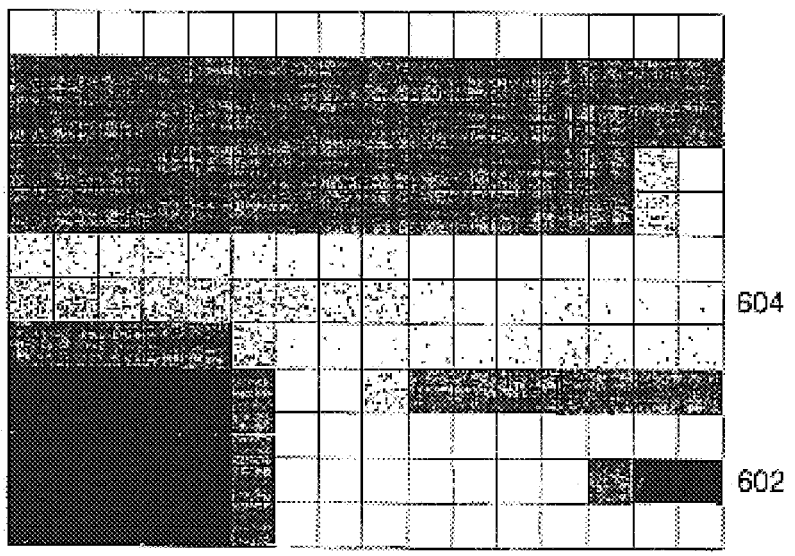
FIG. 6 is a diagram that illustrates an exemplary coverage map for the darker horizontal polygons in FIG. 5B where darker areas represent increased coverage.

FIG. 6 is a diagram that shows a coverage map derived from the darkest horizontal wires shown in FIG. 5B. A coverage map holds coverage information for one layer over the equivalent layout area of the corresponding texture. There is preferably a one to one correspondence between a texel in a texture and a coverage map element. The coverage map in FIG. 6 is encoded with gray scale values, darker gray 602 indicate mote coverage, lighter grey 604 indicate less.

Construction of a coverage map preferably includes rasterizing the rectangles from a single layer and adding their coverage values to the map. The preferred embodiments use the assumption that rectangles from the same layer do not overlap so the coverage values add, and preferably saturating to one.

Using coverage and coverage maps, the coverage map unit 226 uses compositing processes to create texture tiles. In the viewer 110, preferably the coverage map unit 226 selectively uses two compositing techniques to create texture tiles. The first compositing technique, coverage map compositing, uses coverage maps explicitly and is a two pass approach. First, the target texels are zeroed, and a scratch coverage map of the same size as the target tile is allocated. Then, for each layer to be composited: (1) a coverage map is created, and (2) the information in the coverage map is used to blend that layer's color into the final texture.

Coverage map compositing has an advantage that a different compositing assumption can be implemented when combining rectangles from the same layer or different layers. The coverage map is preferably created with the assumption that rectangles from the same layer do not overlap while the final blending is made and the coverage values are independent for rectangles from different layers. However, coverage map compositing can be computationally expensive because for each layer to be processed, each coverage map element is written (e.g., when initially set to zero), and read (e.g., when finally blended) a minimum of one time, and a read is required of each final texel value for blending. Accordingly, an overall computational cost of creating a texture tile can be more related to the number of layers to process than the number of rectangles to rasterize. However, for tiles high up in the pyramid, when there are many rectangles to process, the rectangle processing time to process them is greater than or swamps out the cost of memory access, making coverage map compositing feasible for these tiles.

The second compositing technique used by the coverage map unit 226, direct compositing, avoids using the coverage map (and associated computing costs) altogether. First, the final texel values are set to zero. Then, each rectangle is rasterized and composited directly into the final texture. Direct compositing has the advantage that the time to create a tile is only related to the number of rectangles to process, not to the number of layers. However, in direct compositing the same assumption must be made that rectangles from the same layer do not overlap when combining coverage values of the same or different layers, which introduces errors regardless of the assumption. Direct compositing is usually slower than coverage map compositing for tiles whose creation time are dominated by rectangle processing. However, direct compositing can be much faster for tiles that would have sparse coverage maps.

The opaque tiles unit 228 of the viewer 110 generates images in a process that makes rectangles above other rectangles completely occlude the lower tiles (beneath). The opaque tiles unit 228 preferably performs compositing from front (most visible) to back (least visible) using the direct compositing technique. The viewer 110 preferably allows arrangement of the chip layers by the user arbitrarily so the opaque tiles unit 228 assumes that the layers have been placed in some stacking order that determines visibility.

Using destination color ($C_{dst}$) and destination coverage ($\alpha_{dst}$), and source color ($C_{src}$) and source coverage ($\alpha_{src}'$), a resulting color ($C_{dst}'$) and resulting coverage ($\alpha_{dst}'$) generated by opaque compositing can be determined the following equations:

$$\alpha_{src}' = (1-\alpha_{dst})\alpha_{src} \quad (1)$$

$$\alpha_{dst}' = \alpha_{dst} + \alpha_{src}' \quad (2)$$

$$C_{dst}' = C_{dst} + C_{src}\alpha_{src}' \quad (3)$$

Equations (1)–(3) signify the "plus" operator with modifications. The coverage $\alpha_{src}'$ is an amount of visibility for the incoming rectangle given that the texel is already covered by $\alpha_{dst}$. As described above, direct compositing requires that one assumption be made when combining coverage values. The usual assumption of independent overlap is captured in Equation 1.

When $\alpha_{dst}$ is 1, meaning the texel is completely "filled", the opaque compositing computation can be skipped because $\alpha_{src}'$ will be 0. However, such a computational shortcut is only possible because compositing was processed from front to back. When $\alpha_{src}$ is 0, the computation can also be skipped because the rectangle does not add anything to this texel. When $\alpha_{dst}$ is 0, the texel will have a resulting color and coverage equal to the incoming rectangle, which corresponds to the first time a texel is written.

Figure 7C:
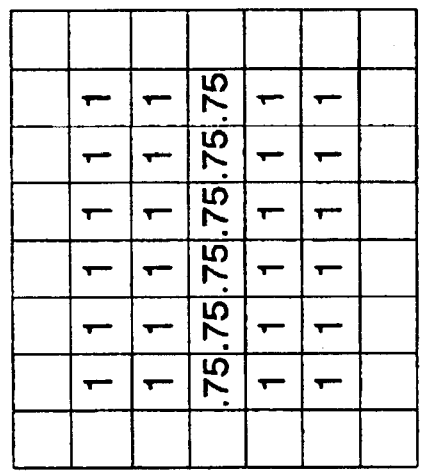
FIGS. 7A–7C are diagrams that illustrate coverage map representations of adjacent polygons.
Figure 7B:
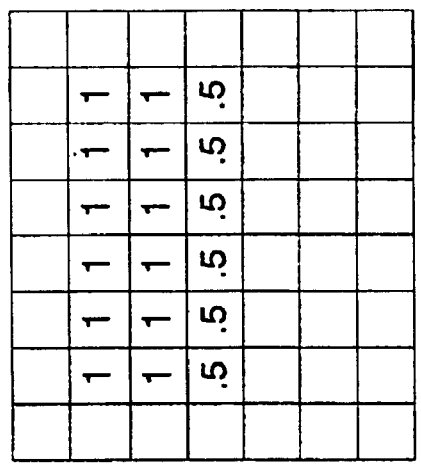
Figure 7A:
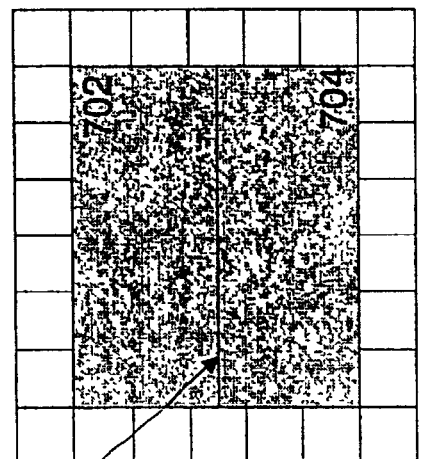

However, when the assumption of independent overlap is applied to rectangles from the same layer that intersect the same texel, errors can occur. FIG. 7A shows two rectangles 702, 704 from the same layer that share an edge 706 being composited across texel boundaries. FIG. 7B shows the $\alpha_{dst}$ values after the top rectangle 702 is rasterized, and FIG. 7C shows the $\alpha_{dst}$ values after both rectangle 702, 704 have been rasterized. When the second rectangle 704 is rasterized, the $\alpha_{src}'$ values computed by Equation 1 are (1−0.5)0.5=0.25 along the shared edge 706, which leads to a final value of 0.75 for $\alpha_{dst}$ along the edge 706. The correct value is 1.0, and a consequence of such compositing errors is that rectangles from the same layer that abut will have a line of a different color between them. As described above, the coverage map compositing avoids such errors since the coverage values are added during the creation of the coverage map, which yields the correct results.

As described above, Equation 1 captures the behavior of independent overlap of polygons. Equation 1 is correct for polygons on different layers, but for polygons on the same layer, an assumption of disjoint overlap is more appropriate. This behavior can be determined by the following equation:

$$\alpha_{src}' = \min(1-\alpha_{dst}, \alpha_{src}) \quad (4)$$

Accordingly, the opaque tiles unit 228 preferably determines when rectangles from the same layer or different layers are being composited by introducing an additional or a third texel element, which is hereafter called a texel layer identifier, for use with $C_{dst}$, and $\alpha_{dst}$. Since compositing is done from front to back, the texel layer identifier preferably is initially zero and then set to the rectangle's layer identifier the first time that the texel is written. The texel layer identifier is preferably an integer that uniquely identifies the layer associated with a rectangle. Subsequently, when a coverage value is added to that texel, a test is performed. If the incoming rectangle is from the same layer as the texel layer identifier then Equation 4 used, otherwise Equation 1. The computation cost of this additional element is not high since it only requires one additional test per texel.

However, an error still occurs in other situations. Specifically, when three or more rectangles contribute to a texel, and two of the rectangles are from the same layer other than the top layer, the final texel value will be different than if using coverage map compositing. However, this difference has yet to be noticeable. Because the difference in quality between the two compositing strategies is negligible, and direct compositing can be much faster, it is preferred for the opaque rendering style.

The semi-transparent tiles unit 229 of the viewer 110 renders the layers with an opacity ($\alpha_{blend}$) as well as a coverage. The opacity defines how transparent the layers will appear when placed on top of one another. As described above, a texel that has a coverage of $\alpha$ is the same thing as a texel that is fully covered with an opacity of $\alpha$. In the preferred embodiment of the viewer 110, the interchangeable opacity and coverage are preferably multiplied to determine a final value. For example, a texel with a coverage of ⅓ and an opacity of ½ is the same thing as a texel with either a coverage or opacity of ⅙. Compositing is done from back to front so the top layers are blended last giving them the appearance of being on "top".

The process of compositing with opacity is known as an "over" operator. Using the same notation as the previous section, the semi-transparent compositing can be determined by the following equation:

$$\alpha_{blend}' = 1 - (\alpha_{blend}\alpha_{dst}) \quad (5)$$

$$\alpha_{dst}' = \alpha_{blend}'\alpha_{src}' + 1(1-\alpha_{blend}')\alpha_{dst} \quad (6)$$

$$C_{dst}' = \alpha_{blend}'\alpha_{src}C_{src} + 1(1-\alpha_{blend}')C_{dst} \quad (7)$$

When both $\alpha_{src}$ and $\alpha_{dst}$ are 1, the final color is the linear interpolation between $C_{src}$ and $C_{dst}$ by $\alpha_{blend}$. However, when $\alpha_{dst}$ is close to or equal to 0, the final color is the incoming color with an opacity of $\alpha_{blend}$. The effect of watering down layer colors when they do not appear atop of any other layer has been determined to be undesirable since the layer will appear to be blended with the background color. To reduce or eliminate such effects, $\alpha_{blend}'$ is defined to set the incoming rectangle's opacity based on the current coverage. Now when $\alpha_{dst}$ is 0, the incoming rectangle will composite opaquely, and when 1, the incoming rectangle will composite with an opacity of $\alpha_{blend}$ as expected. The effect that Equation 5 produces is that layers that appear by themselves will be opaque while layers that overlap other layers will appear semi-transparent. Such drawing contains more information and has been determined to be more visually intuitive than only compositing semi-transparently. In addition, the layer identifier strategy from direct compositing can also be used for the semi-transparent rendering style, but the errors introduced can be noticeable or detected. Accordingly, coverage map compositing is preferably used by the semi-transparent tiles unit 229 for semi-transparent texel data computation.

The viewer 110 can also create a texture tile by filtering. The texture rendering unit 214 can preferably control the tile creation by filtering. When the viewer 110 determines a texture tile is to be created, a check is made to see if the four tiles that reside "underneath" the target tile were already created. If so, the target tile can be computed directly by filtering from these four tiles. The filtering performed preferably uses the box filter described above. Generally, creating a tile by filtering one level below is much faster than rasterizing the tile directly. Thus, the compositing heuristics described above are not always required.

Regardless of the creation process, the controller 210 of the viewer 110 preferably manages texture tiles and determines how tiles are managed within the context of the chip pyramid 300 given a limited supply of the main memory 104.

As a user changes viewpoints, texture tiles are created and rendered on the display. If left unchecked, the number of texture tiles created and, correspondingly, the amount of memory consumed would grow to the full size of the pyramid. As described above, the memory footprint of a full tiled texture pyramid for a large size IC layout could be on the order of terabytes and is prohibitive.

Accordingly, the controller 210 preferably creates a fixed size texture tile cache 232 in the viewer 110. Computed texture tiles are placed into the texture tile cache 232. When a tile is created and there is no room left in the cache 232, a suitable tile is found to replace. Due to the spatial locality of viewing IC layouts, a least recently used (LRU) policy has been determined to have good performance for the texture tile cache. However, the present invention is not intended to be so limited and the controller 210 can use other policies for the texture tile cache 232.

The size of the texture tile cache 232 is preferably set large enough to avoid capacity conflicts and small enough such that the cache 232 can fit into the main memory 104 of a host platform. If the cache is so large that the application memory footprint does not fit into the host platform's main memory, then performance is degraded. The time spent recomputing a texture tile is generally less than the time needed to swap a computed texture tile from disk. Using a texture tile cache to store portions of the TTP insures a bounded memory consumption of the present invention.

Showing a design at full screen view is a very common operation in VLSI layout editors and layout viewers. Preferably, for user satisfaction the full screen view of the VLSI design should be fast or have a reduced time until display. Further, the full screen view can often be the default and/or initial view. However, the top of the chip pyramid 300 is the most time-consuming to compute. In contrast, the memory cost of these tiles is small. Accordingly, since Applicant determined that having these tiles always available for display is beneficial, the controller 210 preferably precomputes a small number of tiles that make up the upper levels of the chip pyramid 300.

First, the controller 210 must determine how many upper levels of a chip pyramid to precompute. A preferred heuristic is to select the level that coincides with a full screen view when the application window is the same size as the screen 150. Further, a pyramid cap memory or the texture memory 234 is preferably separate from the texture tile cache 232 and allocated specifically for the tiles in upper levels of the chip pyramid (e.g., above the third transition T3 308). However, the present invention is not intended to be so limited. For example, the pyramid cap memory 234 can be located in the texture tile cache 232, if guarantees are provided so that eviction is prohibited. Finally, according to the preferred embodiments, layer coverage information is preferably stored in an uncomposited form in the pyramid cap memory 234 so the tiles can be recreated quickly during a global appearance change.

Frequent operations used by the layout viewer 110 involves hiding layers, changing the order in which layers are displayed, or displaying layers with different colors or transparencies. Such changes require all texture tiles to be recreated even though the design data has not changed. To prevent such problems, coverage map information is preferably kept for the lowest precomputed level in the texture tile portion of the chip pyramid, so that the tiles can be recreated quickly if a global appearance change is made. The lowest precomputed level is preferably stored in pyramid cap memory 234.

An example will now be provided that illustrates creation and use of the data structure. For this example, assume that the top three levels of the chip pyramid are precomputed. The dimensions of the top three levels are 1×1, 2×2, and 4×4 for a total of 21 texture tiles, and the lowest level (the 4×4 level) will have the associated coverage maps. Consider a setup that supports 16 viewable layers, and tiles that are 256 texels on a side. The total memory requirement for the coverage maps is (256×256×16×16) 16 MB assuming each coverage map element is represented by 1 byte. Each texture tile's memory cost is (256×256×4) 256 KB, making the cost for 21 tiles 5.25 MB. Accordingly, the total memory cost of the structure of the pyramid cap is 21.25 MB. Procedurally, to create the precomputed portion, coverage maps are made as described above. Next, the bottom-most level is created using the coverage map compositing described above. Lastly, the higher-level pyramid tiles are created by using the standard box filtering technique.

Now when a global change to the view of the drawn VLSI design occurs, the computation required to recreate the top portion of the pyramid is limited only to recompositing the coverage maps. The recompositing computation time is constant and not dependent on the size of the VLSI design or the number of layout objects contained within.

The hierarchy controller unit 216 of the viewer 110 preferably determines and controls mipmaps for pre-rasterized versions of sub-designs. An IC layout or VLSI design explicitly reuses sub-blocks in the same or multiple chip layers and the viewer 110 preferably re-uses selected sub-designs in the form of instantiated hierarchy. A majority of the processing effort (e.g., computational time) spent in creating a texture tile comes from visiting each polygon in that tile. The computational time can be reduced if the instantiated sub-blocks are pre-rasterized such that iterating over the polygons so represented is unnecessary.

The hierarchy cache 236 is a block of preallocated memory that is preferably used to store pre-rasterized versions of sub-designs having significant reuse or repetition in the VLSI design. Each pre-rasterized sub-design is preferably a complete mipmap for that sub-design. Preferably, the mipmaps are not tiled texture pyramids, because the data is not used directly by the graphics subsystem 120. Pre-rasterized mipmaps of selected sub-designs are directly copied into the chip pyramid 300 as needed.

The hierarchy controller unit 216 preferably selects sub-designs to pre-rasterize by using cells with the highest number of instantiations and largest areas to increase or maximize the utility of the hierarchy cache 236. In the case that two sub-designs are instantiated the same number of times, the larger sub-design is selected since more area will be covered in the base layout. Once such a ranking has been established, the hierarchy controller unit 216 determines which of the sub-designs to pre-rasterize since the hierarchy cache 236 is of finite size.

The hierarchy controller unit 236 preferably computes an utility for each sub-design and ranks the sub-designs from highest to lowest utility. The utility of a sub-design can be determined by the following equation:

$$\text{Utility} = (\text{number of instantions}) * (\text{sub-design area}) \quad (8)$$

The hierarchy controller unit 216 sequentially evaluates the preferably ranked list and computes complete mipmaps for all layers in each sub-design. The memory cost of each sub-design is subtracted from the available memory. Thus, sub-designs are continually placed in the hierarchy cache 236 until the allocated memory space is depleted. Should the main design fit into the hierarchy cache 236, the size of the VLSI design is small and the entire VLSI layout will be pre-rasterized.

Figure 8:
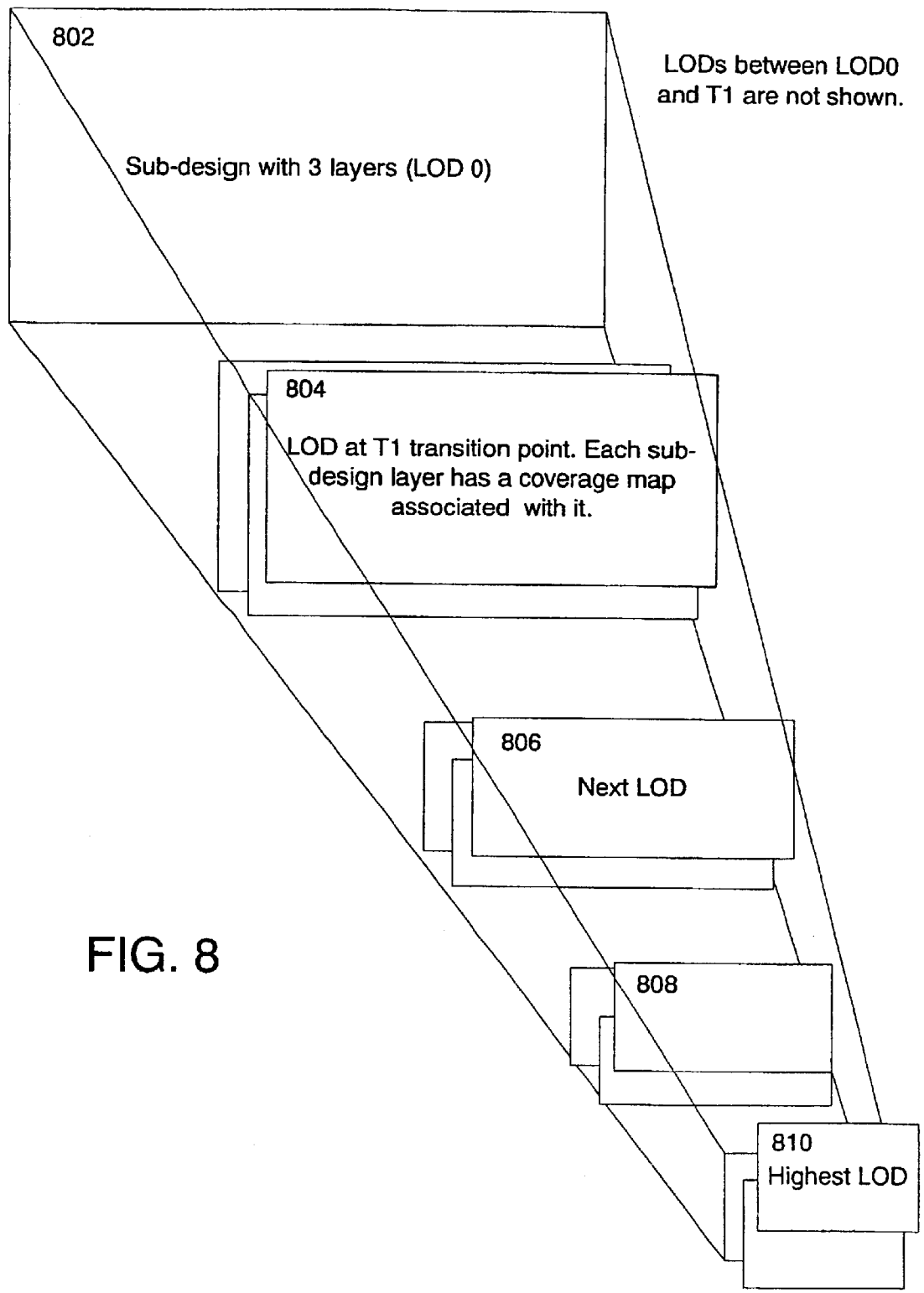
FIG. 8 is a diagram that shows an exemplary hierarchy data format.

The format of the pre-rasterized hierarchy data is preferably the same as the coverage map information described by the coverage map unit 226. As described above, the data needs to be kept as coverage map information so that correct compositing can be done when the texture tiles are created and flexibility is allowed for color combinations. FIG. 8 shows an exemplary representation of how the data is stored. A sub-design at LOD 0 802 exists in canonical form. At the LOD of the first transition T1, each layer in the sub-design is rasterized into a coverage map shown as 804. Then, for each additional LOD 806, 808, and 810, the coverage maps are filtered with the box filter.

Accordingly, the hierarchy data is not kept by the hierarchy controller unit 216 for the lowest levels of the chip pyramid. Evaluations performed determined overall processing resulted in a net benefit (e.g., reduced computations) when the hierarchy controller unit 216 omitted the lowest levels. Accordingly, the lowest levels can be rasterized independent of sub-design information at the those levels. Further, resulting benefits exceed tile creation speed at the lowest levels. Since the lowest two levels represent $15/16$ ths of the total data structure memory cost, eliminating the lowest two levels makes room for 16× more information in a hierarchy cache of fixed size. This allows for larger designs to be pre-rasterized, which in turn makes the hierarchy cache more effective in speeding up the creation of texture tiles where it is used.

The polygon rendering unit 212 of the viewer 110 draws the rectangles or polygons directly to the screen using the canonical form of the VLSI design. As described above, as the user viewpoint moves closer to the base LOD, the tiled texture pyramid ends, and the chip pyramid results in the rectangles being drawn directly. The point at which the transition occurs (e.g., the first transition T1 LOD 304 in FIG. 3) is related to the dimensions of the rectangles to be drawn. For example, drawing rectangles directly with dimensions less than a prescribed amount disadvantageously generates aliasing artifacts.

Selectively drawing rectangles directly has various advantages. First, other shapes such as stipples, labels, and rulers can be applied to the layout more clearly when rectangles are drawn. Further, no memory is consumed or allocated when rectangles are drawn and the contents of the texture tile cache are undisturbed. According to the preferred embodiments, drawing rectangles is not necessary, however, conflicts in the tile cache are reduced or avoided by drawing rectangles to enhance rendering performance.

Regardless of the speed at which the drawing information required for textures is determined, there will still be a finite amount of time to create the necessary texture tiles. The drawing time delay can cause a stutter in the responsiveness of an end application such as the viewer 110. To reduce or mitigate this delay, the chip pyramid 300 preferably allows the viewer 110 to use a multi-threaded approach for textures. The multi-threading display unit 218 preferably controls one thread to render the texture tiles on the display while one or more additional threads are tasked with creating the tiles. Since a tiled approach is used, and each texture tile is completely independent of any other, an N "creator" threads can be used to achieve at most an N speedup, if N processors are available on the host platform.

In the case where the drawing thread does not have all of the texture tiles available, the multi-threading display unit 218 preferably searches a higher level of the chip pyramid for another texture tile that covers the same area. A tile from a higher level in the pyramid will be a coarser view of the desired area, but the lower resolution view of the VLSI layout is preferable to delays or even displaying nothing to a user. In addition, the viewer 110 preferably pre-computes the top part of the chip pyramid. Thus, the coarser view of the entire VLSI layout will always be available for use.

As a result of the multi-threading display unit 218, even as the viewpoint changes very quickly, a layout is displayed even if the layout may become fuzzy because the necessary texture tiles have not yet been created. As the viewpoint remains constant, and the necessary tiles are created, the image preferably is refined according to the viewer 110.

Figure 9:
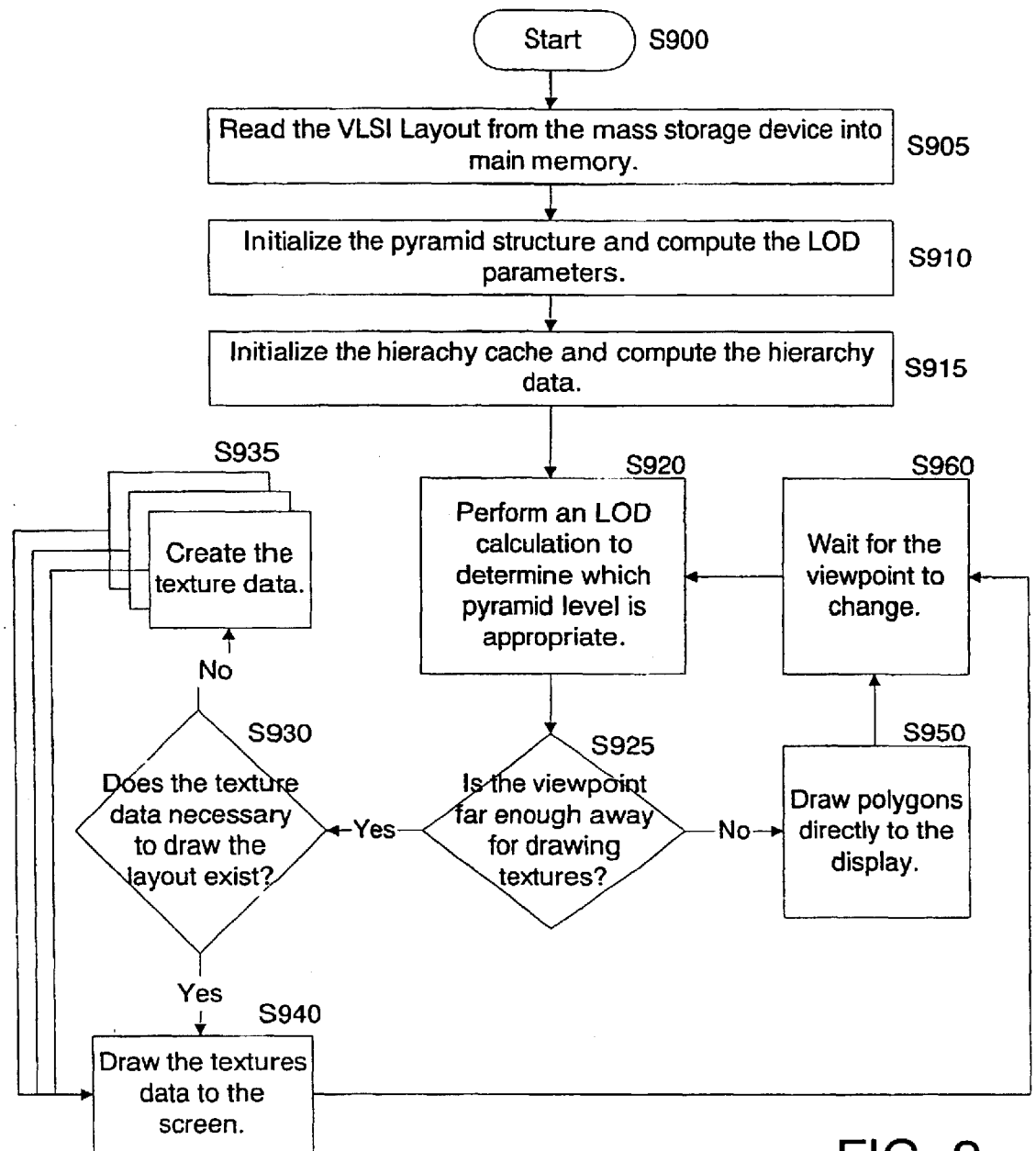
FIG. 9 is a flowchart that illustrates a preferred embodiment of a method for operating a layout editor in accordance with the present invention.

FIG. 9 is a flowchart that outlines a first preferred embodiment of a method for drawing a VLSI layout. First, after starting in step S900, in step S905 a canonical form of a VLSI layout design is transmitted from a mass storage device such as the mass storage device 108 to the VLSI viewer 110 and preferably placed into a working memory such as the main memory 104. Thus, the canonical form is preferably an expression of all or a portion of polygons in the VLSI design in some reduced or minimal database format. The specific location of the canonical expression in the VLSI editor is not critical, but data access times are substantially reduced to the main memory 104.

In step S910, a rendering or chip pyramid structure is initialized and the LOD parameters are computed based on the polygons forming the VLSI layout. The initializing of the chip pyramid structure includes base dimensions (LOD 0) of the VLSI layout from the canonical form of the VLSI layout design. The value of LOD 0 is computed from the bounding box of the underlying VLSI layout given in the units of the design's base grid units. Then, remaining LODs are computed and a first transition threshold T1 between drawing textures and drawing polygons in the chip pyramid structure is determined. T1 is preferably heuristically chosen such that the dimensions of the average polygon of the closest lower LOD will have a value such that aliasing will not occur. From T1, a second transition threshold T2 is chosen at a higher LOD. In the preferred embodiments, T2 was determined to be two LODs higher than T1. Data from a hierarchy cache such as hierarchy cache 236 is used above the second transition T2. The hierarchy cache is not used in levels below T2 in the chip pyramid structure. A preferred embodiment of a chip pyramid structure shown with base dimensions, LODs, and transitions T1 and T2 is shown in FIG. 3.

In step S915, the hierarchy cache is initialized and the hierarchy data is computed. The memory size of the hierarchy cache is arbitrary, but is usually comparable in size to a texture tile cache.

Figure 10A:
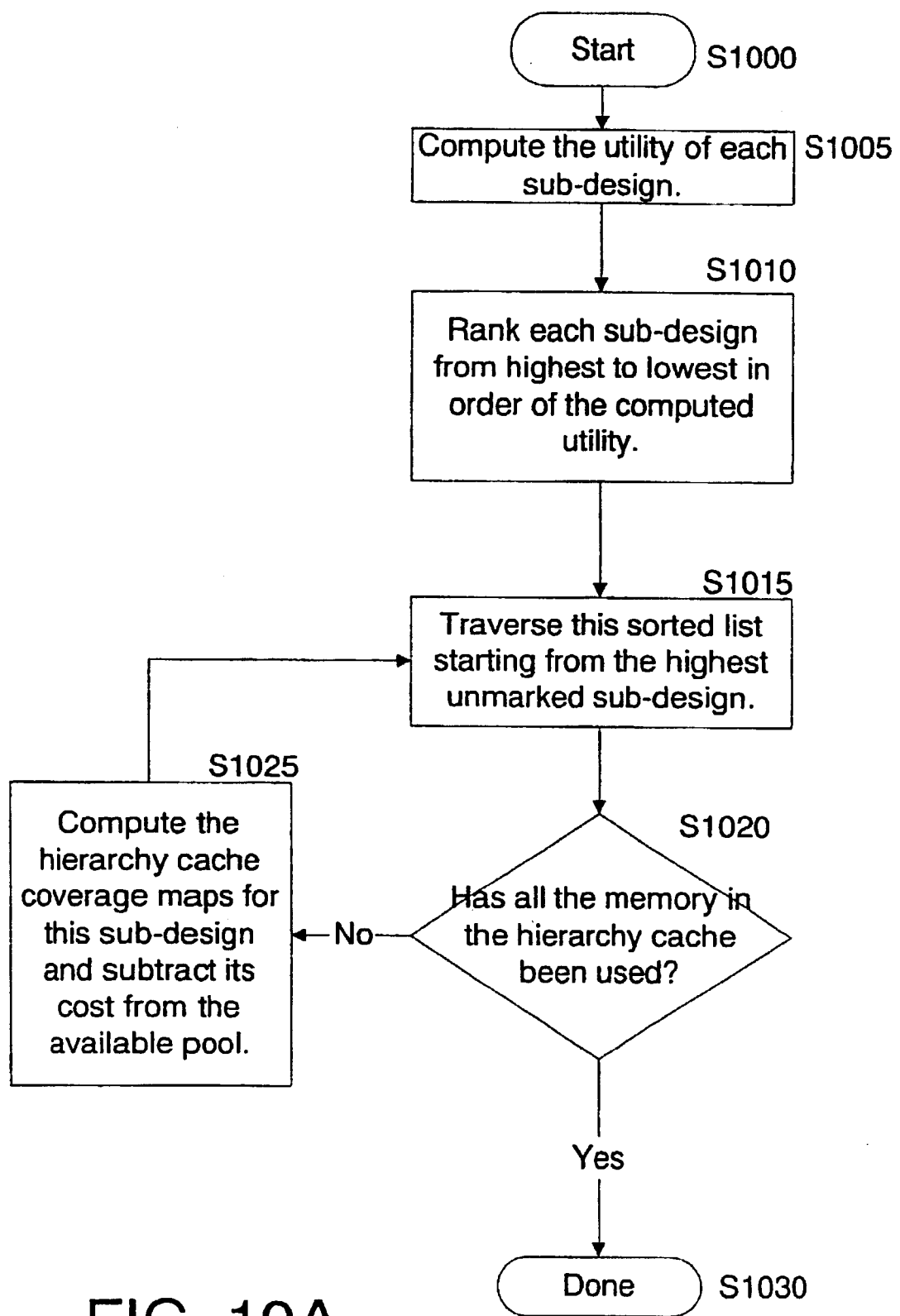
FIG. 10A is a flowchart that illustrates a preferred embodiment of a method for determining a hierarchy cache.

FIG. 10A is a flowchart showing a first preferred embodiment of a method for initialization of the hierarchy cache of step S915. First, after starting in step S1000, in step S1005, a utility metric of each sub-design is computed. The utility metric is preferably a number that signifies how profitable it would be to include a sub-design in the hierarchy cache. The utility metric is preferably determined by the sub-design area multiplied by the total number of instantiations of the sub-design in the main design. Next, in step S1010, all the sub-designs in the main design are ranked by utility metric from highest to lowest, and the memory cost for placing each sub-design in the hierarchy cache is computed. The next step, S1015, the sub-designs are iteratively visited starting from the highest utility metric unmarked sub-design. In step S1020, the available hierarchy memory is compared against the memory cost of this sub-design.

If the cost of this sub-design is determined to be less than the available hierarchy memory in step S1020, then this sub-design is placed in the hierarchy cache in step S1025, and its memory cost is subtracted from the available hierarchy memory pool. Steps S1015, S1020, and S1025 are repeated for all sub-designs and only those designs whose memory requirements are less than the available memory are placed in the hierarchy cache. If the determination in step S1020 is affirmative, control jumps to step S1030, where initialization is complete and control returns to step S920.

Figure 10B:
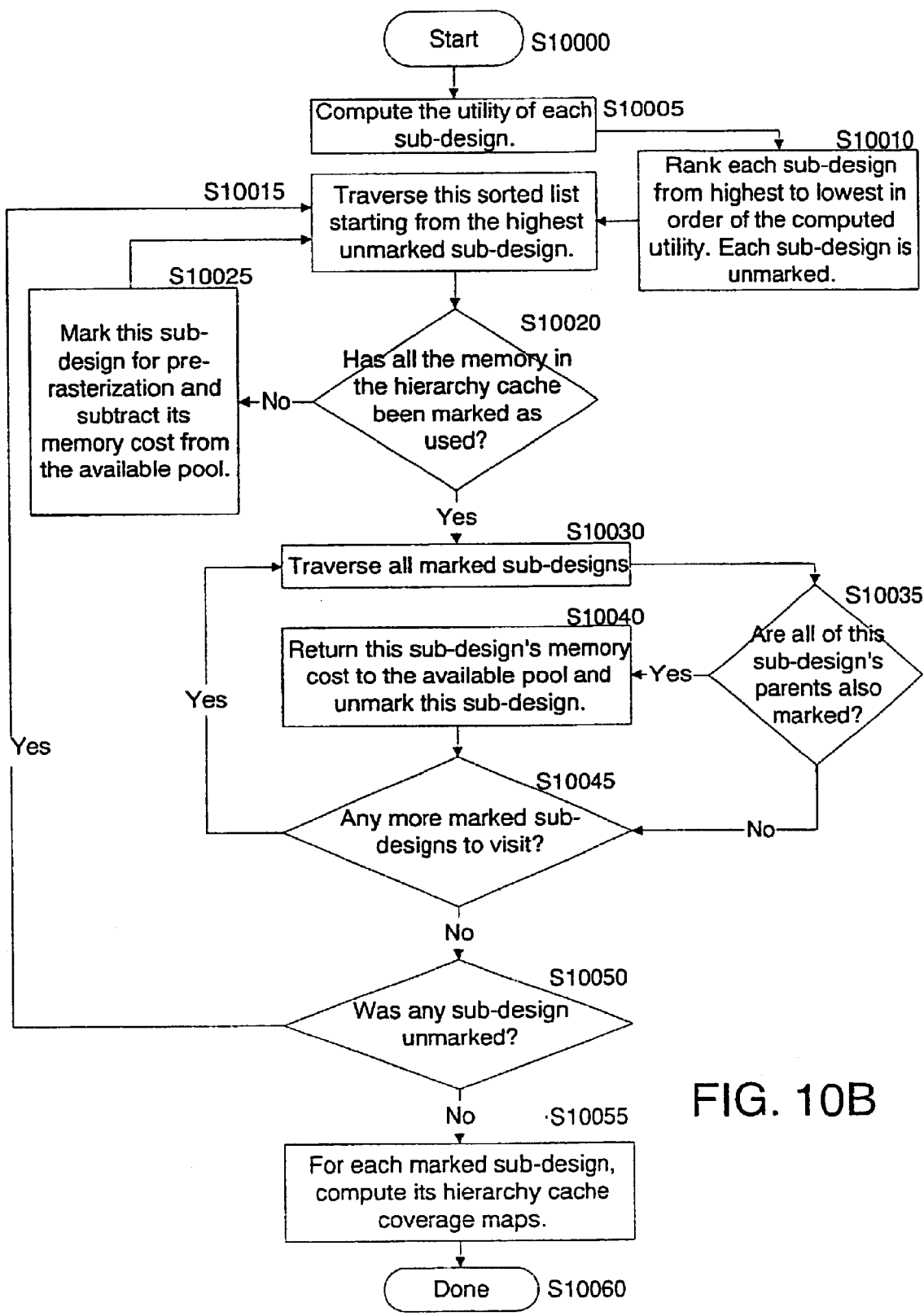
FIG. 10B is a flowchart that illustrates another preferred embodiment of a method for determining a hierarchy cache.

FIG. 10B is a flowchart showing a second preferred embodiment of a method for initialization of the hierarchy cache of step S915. First, after starting in step S10000, in step S10005, a utility metric of each sub-design is computed. The utility metric is preferably a number that signifies how profitable it would be to include a sub-design in the hierarchy cache. The utility metric is preferably determined by the sub-design area multiplied by the total number of instantiations of the sub-design in the main design. Next, in step S10010, all the sub-designs in the main design are ranked by utility metric from highest to lowest and each sub-design is set to "unmarked." Also, the memory cost for placing each sub-design in the hierarchy cache is computed. The next step, S10015, the sub-designs are iteratively visited starting from the highest utility metric unmarked sub-design. In step S10020, the available hierarchy memory is compared against the memory cost of this sub-design.

If the cost of this sub-design is determined to be less than the available hierarchy memory in step S10020, then this sub-design is marked in step S10025, and its memory cost is subtracted from the available hierarchy memory pool. Steps S10015, S10020, and S10025 are repeated until no additional sub-designs may fit into the hierarchy cache. If the determination in step S10020 is affirmative, control jumps to step S10030, where all the sub-designs that were marked are visited and a check is made in step S10035 to see if all of a current sub-design's parents have also been marked. If the determination in step S10035 is affirmative, then in step S10040, the current sub-design is unmarked and its memory cost is added back to the available hierarchy memory pool. Otherwise, control passes directly from step S10045. Steps S10030, S10035, S10040 and S10045 are repeated until it is determined in step S10045 that each marked sub-design has been checked.

In step S10050, a check is made to determine if the previous loop unmarked any sub-designs. If the determination in step S10050 is affirmative, control jumps back to step S10015 to place other additional unmarked sub-designs in the hierarchy cache. Otherwise, control continues to step S10055 because no more sub-designs may fit in the hierarchy cache. In step S10055, the actual creation of the hierarchy data is performed. In step S10060, a process for the initialization of the hierarchy cache is complete and control returns to step S920. The second preferred embodiment of a method for initializing the hierarchy cache as shown in FIG. 10B can be considered a less general approach optimized for viewing.

FIG. 8 is a drawing that shows an exemplary embodiment for a structure of the hierarchy data created in step S1025. For each layer in the sub-design, a coverage map is made for that layer starting at the LOD corresponding to T1. The coverage maps at the LOD of T1 are preferably created using the coverage map creation described above. The subsequent LOD coverage maps are preferably created using the box filter techniques.

Returning now to FIG. 9, next, in step S920, an LOD calculation is performed to determine which level of the rendering pyramid structure is appropriate for the initial display of the VLSI layout. Preferably, the selected level allows an initial display to show the entire VLSI layout within the screen limitations of the selected display. However, the present invention is not intended to be so limited. For example, a preselected portion and/or a preselected layer of the VLSI design could be set as the initial LOD. In step S925, the viewpoint is checked to determine whether the user viewpoint is far enough away (e.g., a high enough level on the rendering or chip pyramid structure) for drawing textures to display the VLSI layout. In step S925, the current LOD is preferably compared to the computed first transition T1 for the VLSI layout, and if the user viewpoint determines textures should be drawn, control continues to step S930. Otherwise, control continues step S950 where the current LOD of the user viewpoint falls beneath the first transition T1 on the chip pyramid structure so that polygons are drawn directly to the display from the canonical form of the VLSI layout. The directly drawn polygons can be formed using an opaque or a semi-transparent style.

Figure 11:
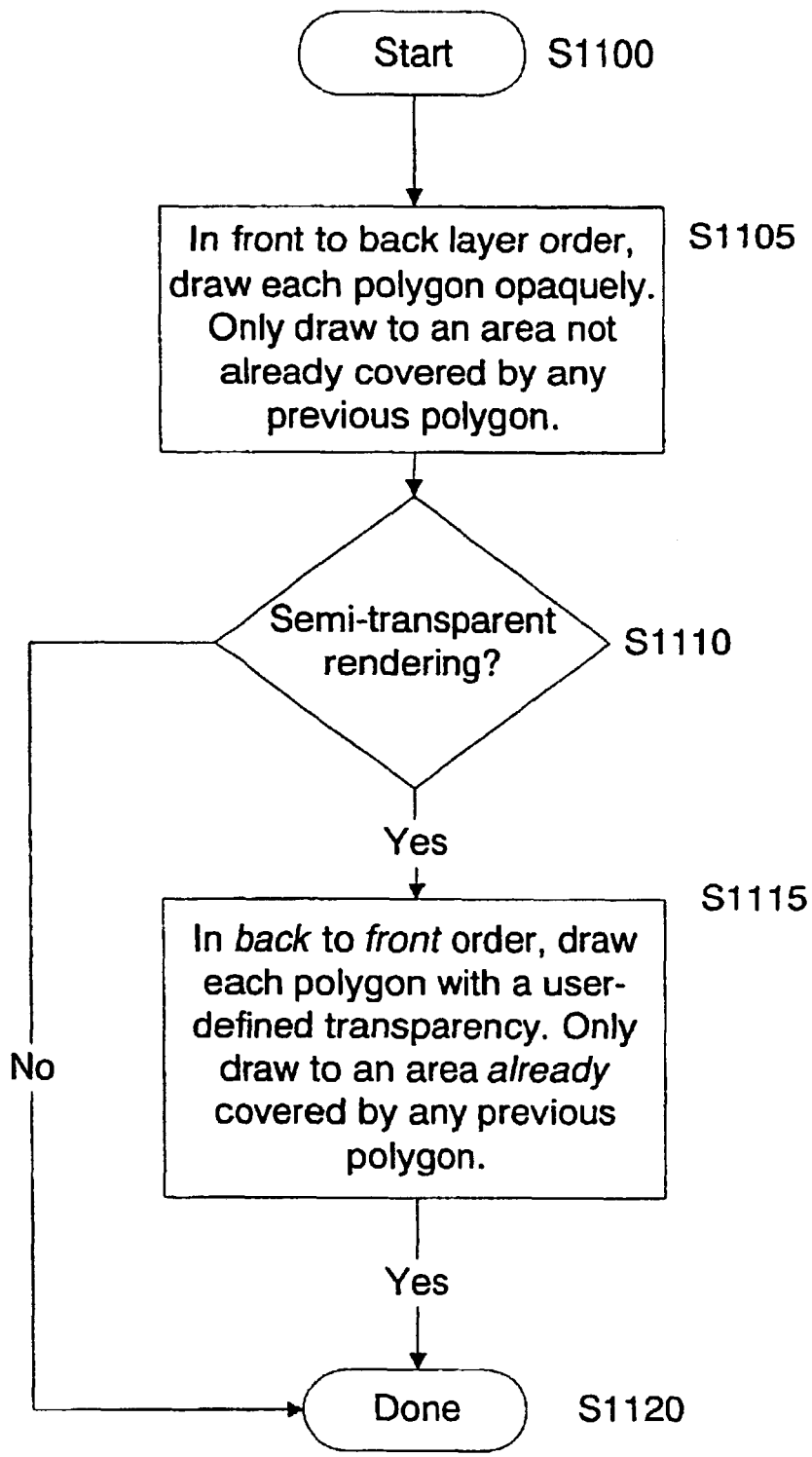
FIG. 11 is a flowchart that illustrates a preferred embodiment of a method for directly rendering polygons.

FIG. 11 is a flowchart that shows a first preferred embodiment of the directly drawing polygons process of step S950. First, after starting in step S1100, in step S1105, each polygon is preferably opaquely drawn in a front-to-back layer order. For a front-to-back layer order, polygons are only drawn to areas not already covered by any previously drawn polygon in step S1105. Thus, polygons that have been user-selected to appear "on top" of other polygons appear as such when displayed. Other techniques could be used, for example, polygons could be drawn in step S1105 from back-to-front order so that the later drawn polygons are allowed to occlude those already drawn. From step S1105, control continues to step S1110 where it is determined if semi-transparent rendering is required. If semi-transparent rendering is determined in step S1110, control continues to step S1115. Otherwise, control jumps to step S1120.

In step S1115, each polygon is drawn with a user-defined transparency in a back-to-front order. Thus, polygons are only drawn in an area that is already covered by a previous polygon. The prescribed transparency can include various transparency schemes such as a opacity from 0 to 1 where 0 signifies fully transparent and 1 signifies fully opaque. An alternative method technique to use in step S1115 draws all polygons with a defined opacity regardless of whether another polygon has already been drawn. The effect produced, however, is that polygons displayed by themselves against the background will appear to blend with whatever background is used. This artifact can be distracting for certain backgrounds. The procedure in step S1115 ensures that the polygons that appear by themselves are fully opaque and independent of the background, while those polygons that appear on top of others will be correctly transparent. In step S1120, the drawing polygon process ends and control returns back to step S960.

Returning to FIG. 9, in step S930, it is determined if texture data necessary to draw the image in the current LOD exists. If the texture data in step S930 exists, control continues to step S940. In step S940, the existing textures data are drawn to the display screen. From steps S940 and S950, control continues to step S960, where the process waits for the user viewpoint to change. Upon detection of a change in the user viewpoint, control returns to step S920 where the LOD calculation determines which level of the rendering pyramid structure is appropriate for the newly selected user viewpoint. Although not shown in FIG. 9, explicit user commands can prompt the change of user viewpoint without waiting for completion of the VLSI layout currently being drawn to the display screen. In this case, control would also return to step S920 upon indication of the explicitly selected user viewpoint.

If the determination in step S930 is negative, control continues to step S935 where the texture data is created. In step S935, the texture data required for the viewpoint of the user is created. Texture tiles are preferably stored in a cache of texture tile memory such as texture tile cache 232. At step S935 of FIG. 9, more than one texture tiles will generally be visible on the display. Each of the texels in those tiles are computed in step S935. Since each texture tile is completely independent of another, multiple processes can be used in parallel. Thus, for a VLSI layout editor with N processors, N texture tiles can be created simultaneously in approximately the time for one processor to create one texture tile. The independent concurrent texture tile generation is indicated by the stacked shadow blocks forming step S935.

When a texture tile is needed, preferably, a check is made to determine whether the texture tile exists in the texture tile cache due to previous computation. If so, the texture tile is simply used again from the texture tile cache and an update time for that texture can be reset (e.g., to a current time). If a particular texture tile is not available, then it must be placed in the texture tile cache. If the texture tile cache is full, any texture tile replacement policy such as least recently used (LRU) or most recently used (MRU) can be implemented. However, because of the spatial and temporal locality of consecutive viewpoints, LRU is preferably used. Above the transition threshold T2, (e.g., hierarchy data cutoff threshold) hierarchy data is used in computing the texture texel values. If the texture tile cache is not full, however, the texture tile can simply be created and added to the cache.

Figure 12:
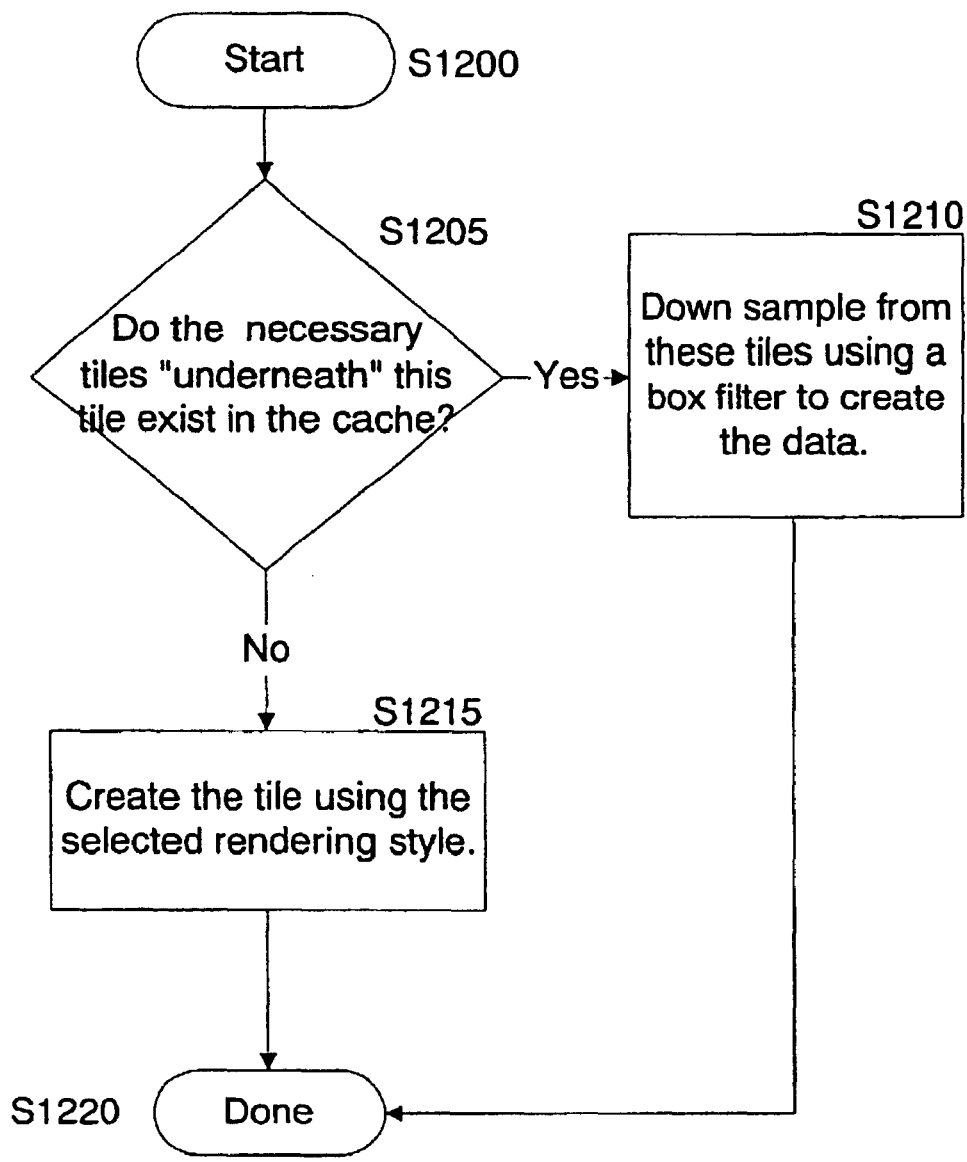
FIG. 12 is a flowchart that illustrates a preferred embodiment of a global texture tile creation process.

FIG. 12 is a flowchart that shows a first preferred embodiment for creating a texture tile. First, after starting at step S1200, in step S1205, a determination is made whether the necessary texture tiles "underneath" the current texture tile are available in the texture tile cache. The definition of "underneath" is "covering the same area at one LOD below the current LOD". If the determination in step S1205 is affirmative, proceed to step S1210, where the texture tile can be created directly from the "underneath" tiles. If, however, the determination in step S1205 is negative since the "underneath" texture tiles do not exist, then control continues to step S1215. In step S1210, the box filter is preferably used to compute the texture tile. In the box filter, four texels arranged in a square can be averaged down to produce one texel at an accuracy of one LOD higher. Using the box filter in step S1210 is usually much faster than step S1215. From step S1215 and step S1220 where the texture tile has been created, control continues to step S1220 to terminate.

Figure 13:
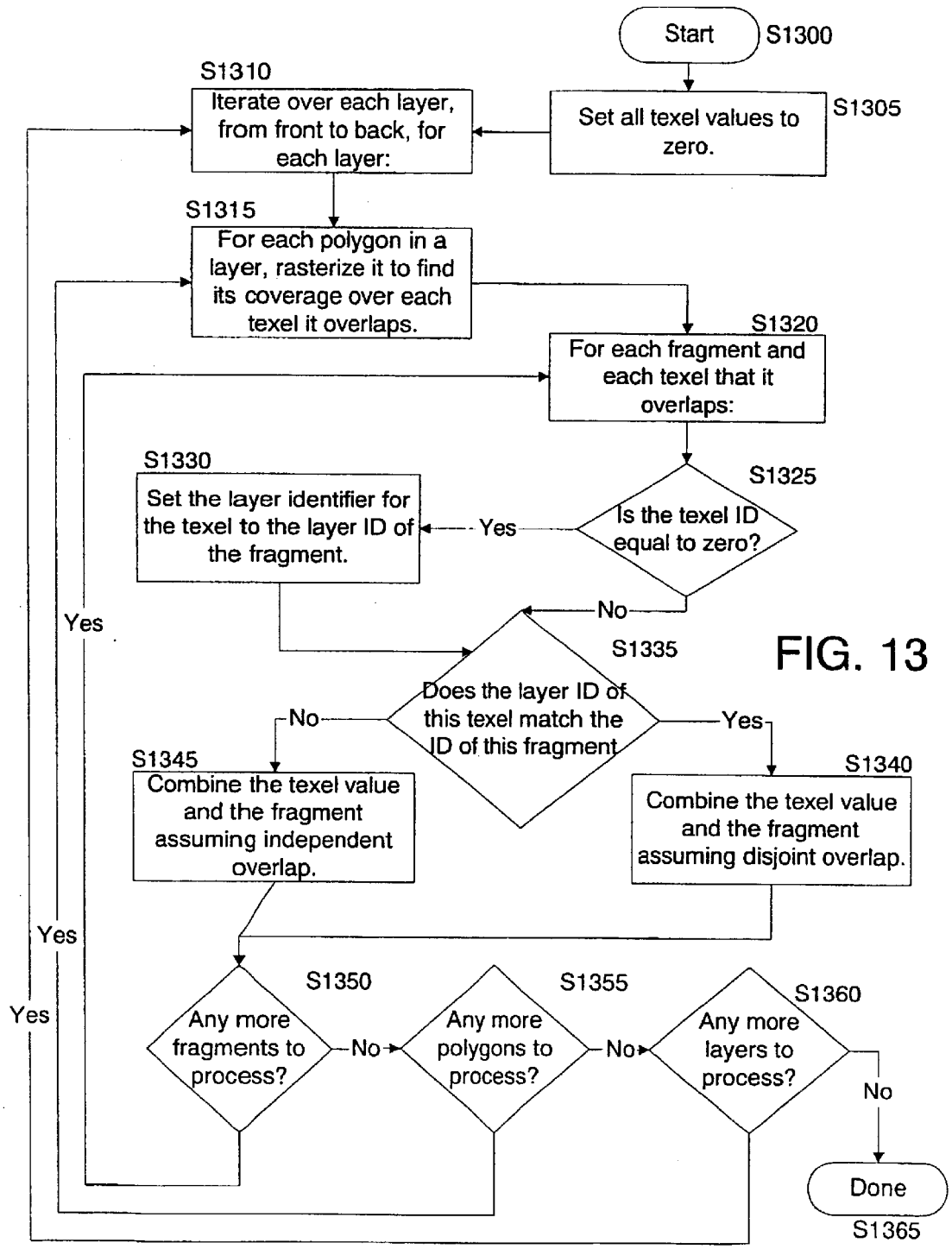
FIG. 13 is a flowchart that illustrates a preferred embodiment of a method for creating opaque texture tiles.

FIG. 13 outlines a first preferred embodiment of an opaque texture creation process of step S1215. First, after starting at step S1300, in step S1305, all texel values are set to 0. In step S1310, for all layers of the main design, each polygon is sequentially evaluated in a predetermined order preferably from front-to-back. An initial polygon for the predetermined order is chosen as the selected polygon. In step S1315, for all polygons of the layer, each polygon is rasterized to determine its coverage over each texel it overlaps. In step S1320, for all fragments in the polygon, each fragment is composited into the final texture. Steps S1310, S1315 and S1320 make up three loop constructs that iterate over every layer in the main design, every polygon in the layer, and every fragment in each polygon, respectively. Each of the three loops check a terminate condition in steps S1350, S1355, and S1360, respectively. When all three terminate conditions are true, the control continues to step S1365, where the process is completed.

In step S1325, the texel ID in question for a fragment is compared against zero or a predetermined number. The ID of a fragment or a texel is an integer associated with each layer of the main design. The ID integers are arbitrarily assigned and can be any value except zero. If the comparison to zero is successful in step S1325, the texel has not been written before, and control continues to step S1330 where the texel ID is set to the fragment's ID. From step S1330, and if the comparison against zero is negative in step S1325, control goes to step S1335. In step S1335, the ID of the texel is compared against the ID of the fragment. If the IDs match in step S1335, control jumps to step S1345, otherwise control continues to step S1340.

In step S1345, the texel and fragment are combined assuming independent overlap as in Equation 1. In step S1340, the texel and fragment are combined assuming disjoint overlap as in Equation 4. From steps S1340 and S1345, control continues to step S1350. In step S1350, processing a single fragment is complete, and a determination is made whether additional fragments exist. If the determination in step S1350 is affirmative, control returns to step S1320. Otherwise, control continues to step S1355. If more polygons or layers should be processed, the previous steps will be repeated via processing in steps S1355, S1360 as shown in FIG. 13. Otherwise, the process terminates at step S1365, where control returns to step S1215.

Figure 14:
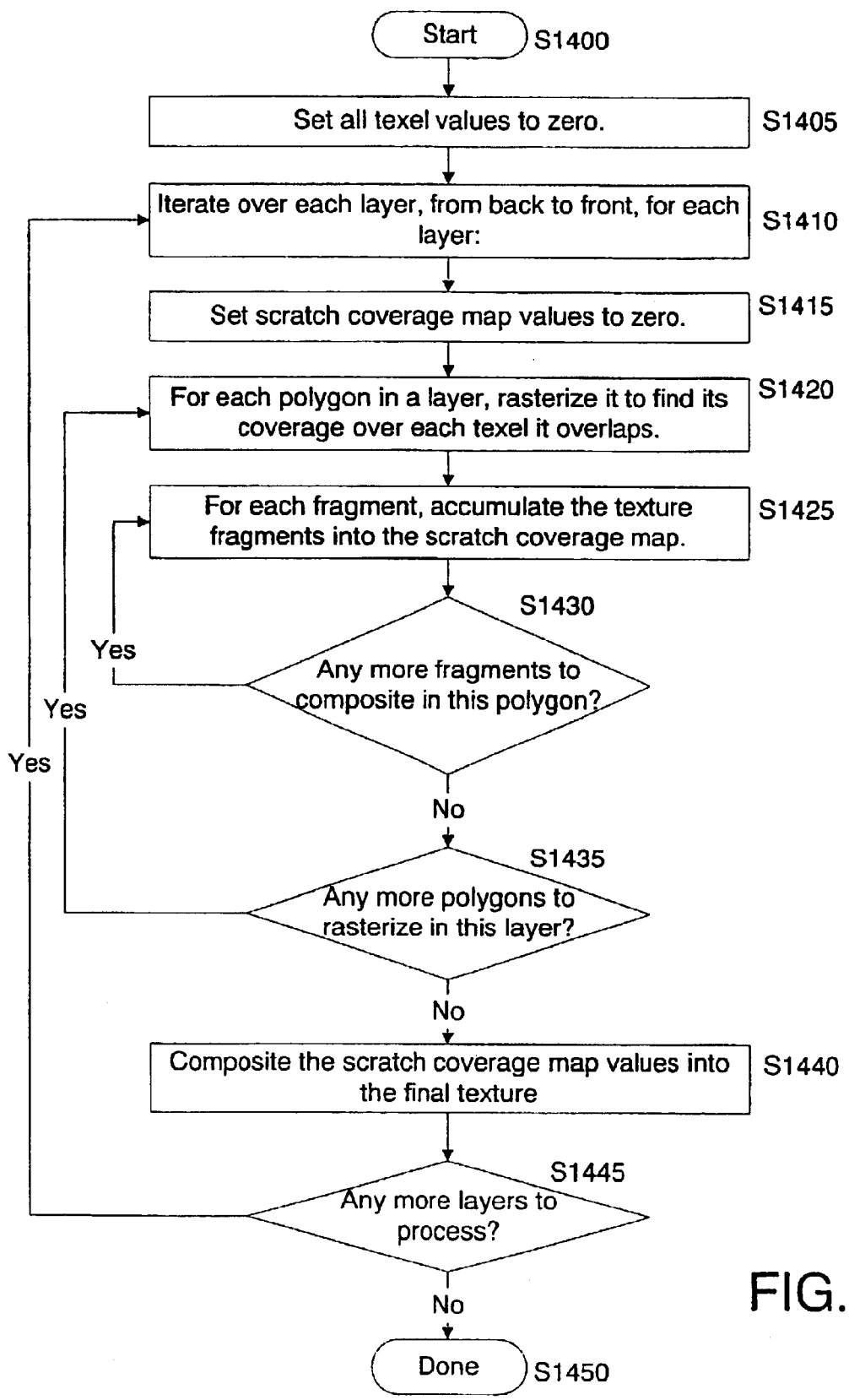
FIG. 14 is a flowchart that illustrates a preferred embodiment of a method for creating semi-transparent texture tiles.

FIG. 14 is a flowchart that shows a first preferred embodiment of the semi-transparent texture creation process of step S1215. First, after starting in step S1400, in step S1405, all the texels are initially set to zero. In step S1410, for all layers of the main design, each layer of polygons is iterated over in a back-to-front ordering. Starting with the first layer, control continues to step S1415 where the temporary scratch coverage map is initialized to all zero. In step S1420, each polygon in the layer is rasterized and its coverage over each texel is computed. For every fragment of the polygon, in step S1425, the fragment amounts are accumulated into the temporary scratch coverage map. Steps S1425 and S1430 are repeated for each fragment of the polygon and steps S1420 through S1435 are repeated for each polygon in the layer. If the determination in step S1435 is negative since all the polygons in one layer have been accumulated into the temporary scratch coverage map, control continues to step S1440 where the values in the scratch coverage map are composited into the final texture tile preferably in accordance with equations 6–8 described above. In step S1445, an affirmative determination that additional layers exist to process returns control to step S1410. Otherwise, control continues to step S1450, since all layers have been processed. In step S1450 the process ends and control returns to step S1215.

Figure 15:
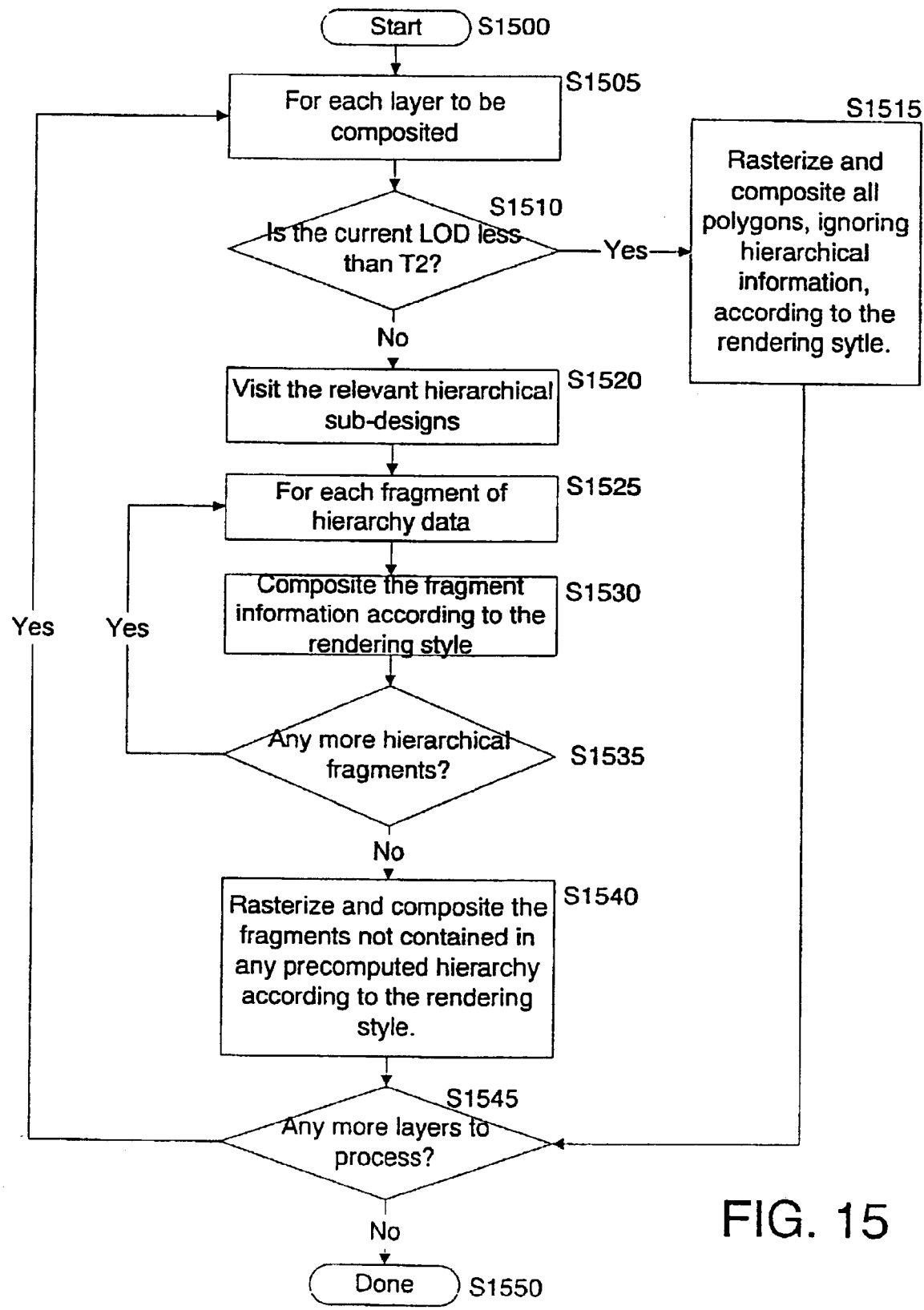
FIG. 15 is a flowchart that illustrates a preferred embodiment of a process for using hierarchy data in texture tile creation.

FIG. 15 is a flowchart that shows a first preferred embodiment of a process for using hierarchy data in the creation of the texture tiles. Exemplary hierarchy data according to preferred embodiments is shown in FIG. 8. The format of the hierarchy data is preferably coverage maps that contains fragment information for chosen sub-designs. Compositing hierarchy data into a final texture is faster than without when the coverage maps are not sparse because the processes needed for rasterization as described in FIGS. 13–14 are avoided. As described above, however, FIGS. 13–14 do not show exactly where and how the hierarchy data is used in creating both opaque and semi-transparent texture tiles. FIG. 15 shows such combinations.

After starting at step S1500, step S1505 iterates over every layer to be composited. In step S1510, a check is made to compare the current LOD against the LOD of the second transition T2. The second transition T2 signifies the point at which hierarchy data is used. If the determination in step S1510 is affirmative, control continues to step S1515 in which no hierarchy data is used and preferred embodiments as described in FIGS. 13–14 are respectively used. However, if the determination in step S1514 is negative, then control jumps to step S1520 where the sub-designs that overlap the texture tile are evaluated. In step S1525, for each coverage map relating to the current layer, each fragment of the coverage is evaluated. In step S1530, the fragments are composited according to preferred embodiments as described in FIGS. 13–14 depending on the current rendering style. In step S1535, if it is determined additional fragments exist, control returns to step S1525. Otherwise, once all coverage map elements for each sub-design have been evaluated, control shifts to step S1540 where the remaining polygons that were not part of any chosen hierarchical sub-design are processed according to preferred embodiments as described in FIGS. 13–14. From steps S1515 and S1540 control continues to step S1545, where it is determined if any layers remain to process. If all layers have been processed in step S1545, control continues to step S1550, where the process ends. Otherwise, control returns to step S1505.

Various exemplary embodiments of the present invention have been repeatedly tested and compared to existing systems using the following equipments. The test platform was a Sun Microsystems Ultra 60 workstation with two 450 MHz UltraSparcII processors, 2 GBs of main memory, and an Expert3D graphics card. The OpenGL graphics library version 1.2.1 was used to render the designs, and the operating system was Solaris 2.7. In the comparisons, an exemplary implementation according to preferred embodiments of the present invention will be called "glLayoutView."

Experiments were run to compare the performance of glLayoutView, the Magic Layout System (version 6.5a), and two popular commercial tools, A and B. The Magic Layout System is a publicly available free VLSI design tool. Tool A is primarily used as a layout editor, while tool B is primarily used for viewing large designs. Both of the commercial tools A and B have the ability to draw a scaled rectangle conditionally based on a user-defined threshold. The user-defined feature was turned off in both tools for the following comparison, since glLayoutView draws all rectangles regardless of their scaled size.

A large VLSI design with substantial hierarchy, "SU_Block," and a large VLSI design with no hierarchy, "Flash," were compared. Table 1 lists the statistics for the two designs.

TABLE 1

|  | Total Rectangles | Unique Rectangles | Design Size |
| --- | --- | --- | --- |
| Flash | 4,893,834 | 4,893,834 | 156K × 156K |
| SU_Block | 14,855,372 | 833,820 | 50K × 54K |

The Flash design is a flat layout containing the three metal and two contact layers of the Flash MAGIC Chip. SU_Block is a collection of custom designs containing fifteen assorted metal, active, and contact layers with three times the number of total rectangles, but only ⅙ the number of unique rectangles as the Flash design. The ratio of unique to total rectangles is used to reflect how much hierarchy exists in the design. The last column shows the dimensions of the designs in grid units at the base level. For illustration, if the SU_Block and Flash VLSI design were treated as images or image mipmaps, the size of the image files for only the base level would be 73 GB for Flash and 7.5 GB for SU_Block.

For all tests, glLayoutView was configured with 256×256 texel tiles, a 64 MB texture tile cache, a 64 MB hierarchy cache and a pyramid cap memory stored four precomputed levels. The dimensions of the base level, level zero, when multiplied by 256 are approximately the values in the column labeled "Design Size" of Table 1.

The first performance test compared the tools static rendering performance in rendering the entire design once. For each design and tool, redraw time is recorded for a window sized 1280×1024 pixels. The re-draw time results in seconds, to draw each design once at a full screen view are shown in Table 2.

TABLE 2

|  | Flash | SU_Block |
| --- | --- | --- |
| Magic | 21.5 | 71 |
| B | 18.5 | 76 |
| A | 3.8 | 18 |

Since glLayoutView is multi-threaded, the actual redraw time of the screen is fixed and dependent on the graphics capabilities of the host platform. For an Expert3D graphics card, this time is between 0.01 and 0.25 seconds depending on the number of tiles to draw and whether the tiles have been loaded into the graphics accelerator. For glLayoutView, the 1280×1024 window size best corresponds to pyramid level five (49 tiles) in SU_Block, and level seven (25 tiles) in the Flash design. For comparison to Table 2, the baseline and following numbers for glLayoutView are the times to create and initially draw the texture tiles for the appropriate view. Table 3 lists redraw times, in seconds, for glLayoutView broken down into the three main parts of rendering performance: the time to process or "walk" the design database, the time to compute the textures, and the time to drive the graphics display with the texture data.

TABLE 3

|  | Flash | SU_Block |
|---|---|---|
| Baseline | 7.0 | 6.1 |
| Coverage Map Compositing | 7.0 | 7.1 |
| No Hierarchy Cache | 7.0 | 19 |
| Global Change Time | 0.9 | 3.1 |
| x2 processors | 3.5 | 3.1 |
| x4 processors | 1.8 | 1.7 |

As shown in Table 3, the "baseline" is the time for glLayout View to create the tiles necessary to draw the entire design implementing the chip pyramid. The tiles were created with the opaque rendering style using the direct compositing strategy. In all cases, glLayout View is significantly faster or comparable to the other tools in performing this task. The second row shows the time to create the tiles using the coverage map compositing for semi-transparent tiles. Both times are about the same as the baseline since the rectangle computation time swamps out the memory access time that can slow down the coverage map compositing. The third line shows the effect of the hierarchy cache. The Flash design's time is the same since it contains no hierarchy, while the SU_Block design's time shows a 3x slowdown versus the baseline time, demonstrating the value of the hierarchy cache.

As shown in Table 3, the fourth row shows the effects of pre-computing the top of the chip pyramid. In both designs, this recomputation time is beneficially faster than the time to draw it from scratch. Accordingly, this time reflects a delay in redrawing the entire screen if a global change were made to the appearance of the design. The faster recomputation time for Flash versus SU_Block is likely due to the smaller number of layers present. The last two lines show redraw times when parallelized across two or four processors. In the four processor case, glLayoutView was run on a 4x400 MHz UltraSparc II processor system, and the 3.6 speedup was computed by comparing the 1x and 4x tests on this system.

Although the rendering times of glLayoutView (Table 3) compares favorably with the other tools (Table 2), the actual user experience is even better because the tile creation time penalty is only paid each time a tile is not present in the texture tile cache. The computational cost of moving the viewpoint a small amount is nearly zero, while the cost for the other tools is the same as drawing it from the original viewpoint. Thus, to draw a full screen view one hundred times, the cost for glLayoutView is the time to draw the screen once, while the cost for the other tools is the time to draw the screen multiplied by one hundred.

To try to quantify such behavior, in the second performance test each tool was made to go through a series of six (6) viewpoint changes including full screen view, zoom of 2x on the upper left portion of the design, zoom of 2xon the upper right portion of the design, zoom of 2x on the lower right portion of the design, zoom of 2x on the lower left portion of the design, and full screen view. Effects of reusing textures can be measured if the number of intermediate viewpoints to render between the six main viewpoints is varied.

TABLE 4

|  | 0(6) | 1(12) | 3(24) | 6(48) |
|---|---|---|---|---|
|  | Flash | | | |
| Magic | 69 | 139 | 276 | 531 |
| B | 57 | 87 | 151 | 265 |
| A | 15 | 26 | 48 | 86 |
| glLay View | 8 | 8 | 8 | 8 |
|  | SU_Block | | | |
| Magic | 212 | 444 | 929 | 1816 |
| B | 218 | 433 | 700 | 1293 |
| A | 52 | 97 | 184 | 351 |
| glLay View | 9 | 9 | 9 | 9 |

Table 4 shows total redraw times, in seconds, of the two designs from different viewpoints. The column headings represent the number of intermediate viewpoints that were drawn. The total number of rendered frames is shown in parentheses. glLayoutView was run using the chip pyramid including a multi-threaded factor of two.

The first column shows the combined amount of time to render the designs from the six main viewpoints. The remaining columns show the time to render the designs when a different number of intermediate viewpoints are also rendered. As the number of intermediate viewpoints is increased, the movement more closely resembles a smooth animated motion. The effects of the texture tile cache are demonstrated because the render times for glLayoutView are constant.

Figures 16A, 16B:
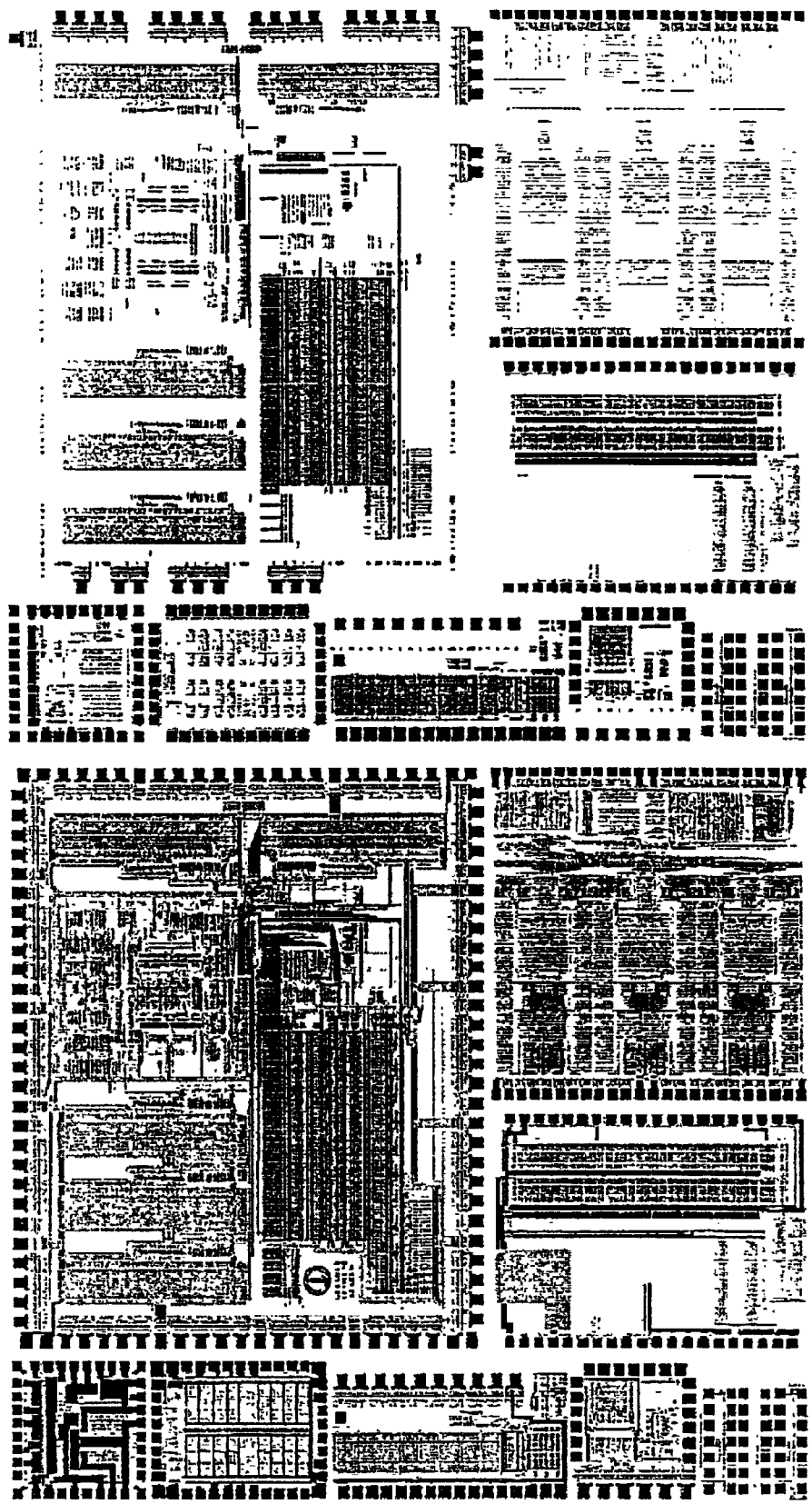
FIGS. 16A and 16B are diagrams that respectively illustrate two drawings of a VLSI design where

FIG. 16A shows glLayoutView rendering the SU_Block VLSI design. FIG. 16B shows a drawing of the SU_Block using the hierarchy cache. The areas shown in FIG. 16B represent the portions of the design that are contained in the hierarchy cache. Approximately 52% of the viewable area is covered by data from the hierarchy cache.

Figure 17A:
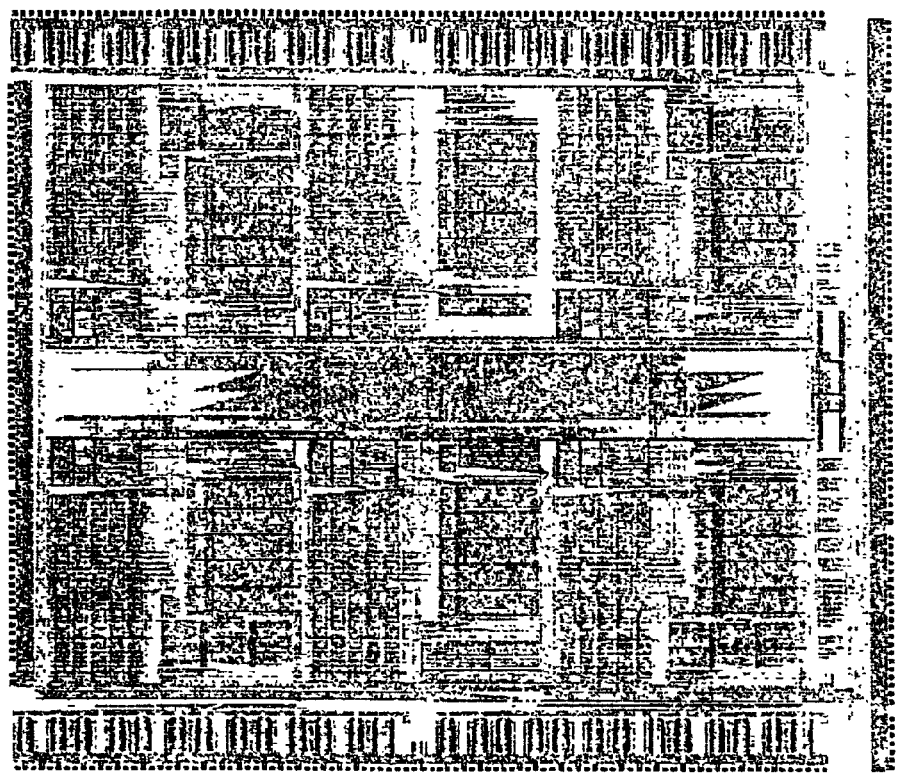
FIGS. 17A and 17B are diagrams that respectively illustrate two drawings of a VLSI design where
Figure 17B:
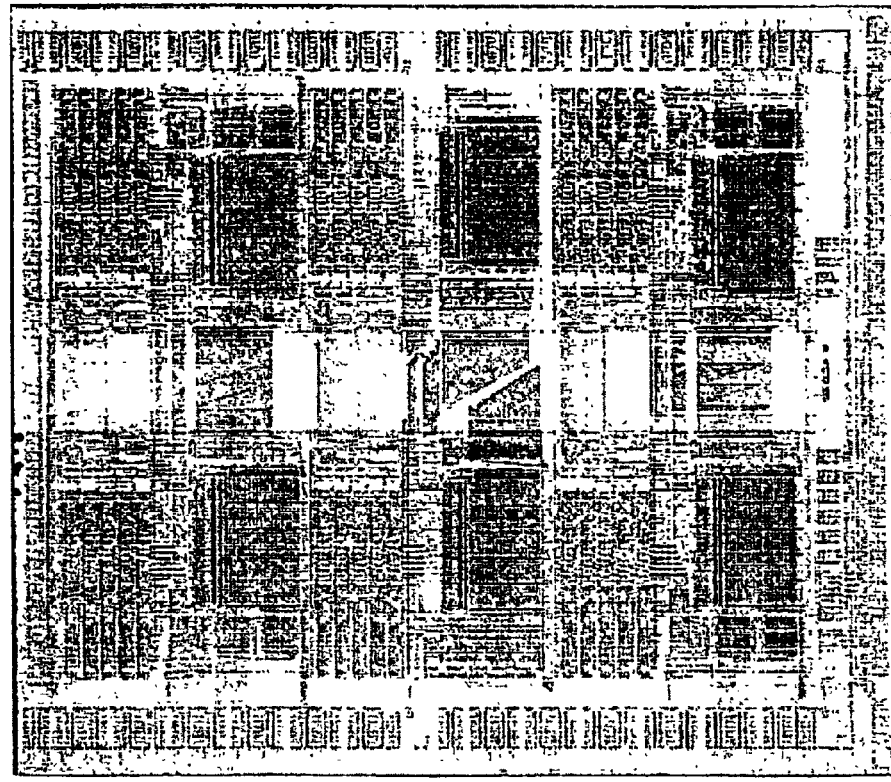

FIG. 17A is a diagram that shows an image of a die photo of another VLSI design. FIG. 17B is a diagram that shows a synthesized image according to a preferred embodiment of the present invention of the design, which highlights the photo-realistic results.

As described above, preferred embodiments of a VLSI layout editor and methods for using same have various advantages. Preferred embodiments according to the present invention save and reuse selected parts of the image over again, using for example texture mapping, to render the VLSI layouts, and make sure the image on the screen is optically accurate. Such reuse also allows the creation of texture tiles on multiple processors that simultaneously allow for the rendering process to be sped up by a factor related to the number of processors. Further, the preferred embodiments use hierarchy by explicitly computing and using sub-designs to speed up the display process. Polygons are directly drawn from the canonical form of the VLSI design at some LODs where texture data is ignored. In addition, the preferred embodiments implement a chip pyramid having multiple regions using different operations or combinations of operations responsive to a particular VLSI design.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An apparatus, comprising:
a first memory that stores a representation of an integrated circuit (IC) layout having a plurality of layers; and
a controller coupled to the first memory that generates a displayable representation of ordered layers of the IC layout that tracks changes in a user viewpoint, wherein the displayable representation comprises a precomputed image that represents a part of the IC layout, and wherein the precomputed image is used in two or more user viewpoints.

2. The apparatus of claim 1, wherein the precomputed image is a stored image that can be used again.

3. The apparatus of claim 2, wherein the precomputed image is a texture.

4. The apparatus of claim 2, wherein the stored image is generated by a graphics application and stored by the controller.

5. The apparatus of claim 1, wherein the controller determines a chip pyramid structure having a plurality of levels corresponding to the representation of the IC layout, wherein the levels are each a level of detail (LOD) from a base LOD to a top LOD, wherein the top LOD includes more area of the displayable representation of the VLSI layout than the base LOD, and wherein the displayable representation is generated using the chip pyramid structure.

6. The apparatus of claim 5, wherein the IC layout representation is determined by a canonical expression.

7. The apparatus of claim 5, wherein the plurality of levels of the chip pyramid structure are based on scaled powers of two (2).

8. The apparatus of claim 5, further comprising a filter that filters data forming the displayable representation so that the data is represented at different levels of the chip pyramid.

9. The apparatus of claim 5, wherein the chip pyramid structure has a first transition threshold, wherein the displayable representation is generated from at least the precomputed image in levels above the first transition threshold, and wherein the displayable representation is generated directly from the IC layout representation below the first transition threshold.

10. The apparatus of claim 9, wherein an LOD of the first transition is determined based on an average shorter dimension of objects of the IC layout.

11. The apparatus of claim 9, wherein an LOD of the first transition threshold (T1) is determined by $2^{LODT1} \geq$ (average minimum dimension of each element in the IC layout)/(smallest desired element drawn to a display screen).

12. The apparatus of claim 9, wherein the directly generated displayable representation is drawn to a display screen and discarded.

13. The apparatus of claim 9, wherein a prescribed amount of precomputed portions are stored in a second memory with a prescribed priority scheme, and wherein the precomputed image comprises the precomputed portions.

14. The apparatus of claim 13, wherein the precomputed portions are determined responsive to a viewpoint change.

15. The apparatus of claim 14, wherein the viewpoint change includes magnification, selected layer, number of layers, order of layers, selected colors, tile rendering style and relative position vertically over the IC layout, and wherein the precomputed portions contain only data required for display.

16. The apparatus of claim 14, wherein current precomputed portions replace previous precomputed portions as the viewpoint changes according to the priority scheme, and wherein the precomputed portions contain only data required for a current display window size.

17. The apparatus of claim 13, wherein the precomputed portions model objects of the IC layout less than a pixel in dimension.

18. The apparatus of claim 13, wherein the precomputed portions model objects of the IC layout that occur on non-pixel boundaries.

19. The apparatus of claim 13, wherein the precomputed portions representing the objects are generated according to destination color ($C_{dst}$) and destination coverage ($\alpha_{dst}$) and source color ($C_{src}$) and source coverage ($\alpha_{src}'$), a resulting color ($C_{dst}'$) and resulting coverage ($\alpha_{dst}'$) generated by opaque compositing according to the following equations:

$$\alpha_{src}' = (1-\alpha_{dst})\alpha_{src} \quad (1)$$

$$\alpha_{dst}' = \alpha_{dst} + \alpha_{src'} \quad (2)$$

$$C_{dst}' = C_{dst} + C_{src}\alpha_{src'} \quad (3),$$

wherein if an incoming object component is from an identical layer then the following equation $$\alpha_{src}' = \min(1-\alpha_{dst}, \alpha_{src}) \quad (4)$$

is used where a texel layer identifier can be used with $C_{dst}$ and $\alpha_{dst}$, otherwise equation (1) is used.

20. The apparatus of claim 13, wherein the precomputed portions representing the objects are generated according to destination color ($C_{dst}$) and destination coverage ($\alpha_{dst}$), and source color ($C_{src}$) source coverage ($\alpha_{src}$), and opacity ($\alpha_{blend}$), a resulting color ($C_{dst}'$) and resulting coverage ($\alpha_{dst}'$) generated by compositing according to the following equations:

$$\alpha_{blend}' = 1-(\alpha_{blend}\alpha_{dst}) \quad (5)$$

$$\alpha_{dst}' = \alpha_{blend}'\alpha_{src}' + 1(1-\alpha_{blend})\alpha_{dst} \quad (6)$$

$$C_{dst}' = \alpha_{blend}'\alpha_{src}C_{src} + 1(1-\alpha_{blend}')C_{dst} \quad (7).$$

21. The apparatus of claim 13, wherein the controller independently performs determination of data that represents the precomputed portions and display of the precomputed portions.

22. The apparatus of claim 9, wherein the chip pyramid structure has a second transition threshold, wherein the controller determines selected elements of the IC layout, wherein displayable hierarchy data representations are precomputed for each of the selected elements for each level of the chip pyramid structure above the second transition threshold.

23. The apparatus of claim 22, wherein the selected elements are determined based on frequency of use and respective size in the displayable representation.

24. The apparatus of claim 23, wherein the precomputed image comprises textures stored in a second memory, wherein the displayable hierarchy data representations comprise a mipmap for each of the selected elements for all levels of the chip pyramid structure above the second transition threshold, and wherein the displayable hierarchy data representations are stored in a third memory.

25. The apparatus of claim 24, wherein the mipmaps are based on scaled power of two (2).

26. The apparatus of claim 22, wherein the chip pyramid has a third transition threshold, wherein the displayable representation is based on a precomputed representation of the IC layout at said each LOD above the third transition threshold.

27. The apparatus of claim 26, wherein an LOD of the third transition threshold is based on at least one of a corresponding display screen size and a corresponding display resolution.

28. The apparatus of claim 27, wherein a prescribed amount of precomputed portions forming the precomputed image are stored using a prescribed priority in a second memory, wherein the precomputed representation is stored in the second memory with a higher priority, and wherein the selected elements are stored in a third memory.

29. The apparatus of claim 28, wherein rendering a full screen view of the IC layout uses the precomputed representations, wherein the precomputed representations are permanently stored in the second memory.

30. The apparatus of claim 1, wherein the controller independently performs determination of data that represents the displayable representation including the precomputed image and display of the displayable representation.

31. The apparatus of claim 30, wherein each precomputed portions included in the precomputed image is independent from the other precomputed portions, and wherein a plurality of precomputed portions are concurrently determined by the controller.

32. The apparatus of claim 31, wherein the controller comprises a plurality of independent processors that provide a multi-threaded implementation that separates determination of texture data and graphical rendering of the texture data comprising the precomputed portions.

33. The apparatus of claim 1, wherein a prescribed amount of precomputed portions are stored in a second memory with a prescribed priority scheme, and wherein the precomputed image comprises the precomputed portions, and wherein the precomputed portions model objects of the IC layout less than a pixel in dimension.

34. The apparatus of claim 1, wherein a prescribed amount of precomputed portions are stored in a second memory with a prescribed priority scheme, and wherein the precomputed image comprises the precomputed portions, and wherein the precomputed portions model objects of the IC layout that occur on non-pixel boundaries.

35. The apparatus of claim 9, wherein the precomputed image is one of a texture and a pixmap.

36. An apparatus, comprising:
means for loading an integrated circuit (IC) information into a first memory;
means for determining a chip pyramid having a plurality of levels of detail (LOD) from a first LOD to a last LOD according to the IC layout information;
means for determining precomputed hierarchy data for selected sub-designs in an IC above a first transition threshold in the chip pyramid and storing the hierarchy data in a second memory;
means for determining a selected LOD in the chip pyramid to display the IC according to an input viewpoint; and
means for displaying the IC by using the IC information to directly display polygons when the selected LOD is below the first transition threshold and for displaying the IC using at least the hierarchy data above the first transition threshold.

37. The apparatus of claim 36, further comprising means for displaying the IC layout using a stored precomputed image that represents a portion of the IC information, wherein the precomputed image is used in two or more user viewpoints, wherein the precomputed image is used above a second transition threshold that is between the first LOD and the first transition threshold.

38. A method of modeling an integrated circuit (IC), comprising:
loading a layout of the IC into a first storage device;
determining a chip pyramid having a plurality of levels of detail (LOD) from a base LOD to a top LOD according to the IC layout;
determining prescribed hierarchy data for selected sub-designs in the IC and storing the hierarchy data in a second storage device;
determining a selected LOD in the chip pyramid to display the IC layout according to an input viewpoint;
displaying the IC layout using at least the hierarchy data when the selected LOD is above a first threshold; and
displaying the IC layout by using the IC layout from the first storage device to directly display the IC layout when the selected LOD is below the first threshold.

39. The method of claim 38, further comprising repeating the displaying steps responsive to the input viewpoint when the input viewpoint is changed, and wherein the input viewpoint comprises magnification, selected layer, number of layers, order of layers, selected colors, tile rendering style and relative position vertically over the IC layout.

40. The method of claim 38, further comprising displaying the IC layout using a stored precomputed image that represents a portion of the IC layout, wherein the precomputed image is used in two or more user viewpoints, wherein the precomputed image is used above a second transition threshold that is between the base LOD and the first transition threshold.

41. The method of claim 40, wherein the precomputed image and the prescribed hierarchy data comprise textures, and wherein displaying the IC layout using textures above the second threshold comprises:
displaying stored texture tile data forming viewable textures when stored textures contain each of said viewable textures; and
creating the texture tile data forming the viewable textures when the stored textures do not contain said viewable textures.

42. The method of claim 41, wherein the creating texture tile data comprises:
filtering the stored textures to form a current texture when required stored textures exist; and
rasterizing and compositing polygons forming the texture tile data according to a prescribed rendering style when the required stored textures do not exist.

43. The method of claim 42, wherein the rasterizing and compositing polygons comprises independently determining an opacity for each layer.

44. The method of claim 41, comprising independently (a) determining the data that represents the textures and (b) displaying the textures.

45. The method of claim 44, wherein a plurality of textures are independent from each other, and wherein data that represents the plurality of textures are concurrently determined.

46. The apparatus of claim 3, wherein the precomputed image is a pixmap.

47. An apparatus, comprising:
a first memory that stores a representation of an integrated circuit (IC) layout having a plurality of layers; and
a controller coupled to the first memory that generates a displayable representation of ordered layers of the IC layout that tracks changes in a user viewpoint, wherein the displayable representation comprises a precomputed image that represents a part of the IC layout, and wherein the precomputed image is used in two or more user viewpoints, wherein each precomputed portions included in the precomputed image is independent from the other precomputed portions, and wherein the controller comprises a plurality of independent processors that provide a multi-threaded implementation that separates determination of texture data and graphical rendering of the texture data comprising the precomputed portions.

* * * * *